(12) United States Patent
Dadkhah Tehrani et al.

(10) Patent No.: US 10,639,802 B2
(45) Date of Patent: May 5, 2020

(54) SYSTEMS AND METHODS FOR POST-TREATMENT OF DRY ADHESIVE MICROSTRUCTURES

(71) Applicant: ONROBOT LOS ANGELES INC., Los Angeles, CA (US)

(72) Inventors: Mohammad Dadkhah Tehrani, Los Angeles, CA (US); Nicholas Wettels, Los Angeles, CA (US)

(73) Assignee: ONROBOT LOS ANGELES INC., Los Angeles, CA (US)

( * ) Notice: Subject to any disclaimer, the term of this patent is extended or adjusted under 35 U.S.C. 154(b) by 0 days.

(21) Appl. No.: 16/405,398

(22) Filed: May 7, 2019

(65) Prior Publication Data

US 2019/0337162 A1 Nov. 7, 2019

Related U.S. Application Data

(60) Continuation of application No. 16/174,583, filed on Oct. 30, 2018, now Pat. No. 10,363,668, which is a
(Continued)

(51) Int. Cl.
*B25J 15/00* (2006.01)
*C09J 201/00* (2006.01)
(Continued)

(52) U.S. Cl.
CPC ............. *B25J 15/0085* (2013.01); *B81C 1/00* (2013.01); *B81C 1/00206* (2013.01); *C09J 7/00* (2013.01);
(Continued)

(58) Field of Classification Search
CPC ................ B25J 15/0085; B25J 15/0009; B25J 15/0625; B81C 1/00; C09J 7/00
(Continued)

(56) References Cited

U.S. PATENT DOCUMENTS

| 4,135,006 A | 1/1979 | Readal et al. |
| 5,819,508 A | 10/1998 | Kraft et al. |

(Continued)

FOREIGN PATENT DOCUMENTS

WO   WO-2018170471 A1   9/2018

OTHER PUBLICATIONS

Gorb, et al., Biomimetic mushroom-shaped fibrillary adhesive microstructure, J. R. Soc. Interface, (2007) 4, 271-275. Epub Oct. 17, 2006.
(Continued)

*Primary Examiner* — Paul T Chin
(74) *Attorney, Agent, or Firm* — Wilson, Sonsoni, Goodrich & Rosati

(57) ABSTRACT

Provided are systems and methods for the post-treatment of dry adhesive microstructures. The microstructures may be post-treated to comprise mushroom-like flaps at their tips to interface with the contact surface. In some aspects, a change in material composition of the microstructures in a dry adhesive may affect mechanical properties to enhance or diminish overall adhesive performance. For example, conductive additives can be added to the material to improve adhesive performance. In other aspects, microstructures comprising conductive material may allow for pre-load engagement sensing systems to be integrated into the microstructures.

20 Claims, 13 Drawing Sheets

Related U.S. Application Data division of application No. 15/460,440, filed on Mar. 16, 2017, now Pat. No. 10,155,318.

(51) Int. Cl.

| | | |
|---|---|---|
| *C09J 7/00* | (2018.01) | |
| *B81C 1/00* | (2006.01) | |
| *C09J 9/02* | (2006.01) | |
| *C09J 11/04* | (2006.01) | |
| *C08K 3/04* | (2006.01) | |

(52) U.S. Cl.
CPC ............... *C09J 9/02* (2013.01); *C09J 11/04* (2013.01); *C09J 201/00* (2013.01); *B81B 2207/056* (2013.01); *C08K 3/04* (2013.01); *C08K 3/041* (2017.05); *C08K 2201/001* (2013.01); *C09J 2201/626* (2013.01)

(58) Field of Classification Search
USPC ............... 294/213, 192, 103.1; 91/1, 31, 39
See application file for complete search history.

(56) References Cited

U.S. PATENT DOCUMENTS

| | | | |
|---|---|---|---|
| 6,132,807 A | 10/2000 | Hess et al. | |
| 6,494,645 B1 | 12/2002 | Seitz et al. | |
| 7,070,727 B2 | 7/2006 | Calhoun et al. | |
| 8,206,631 B1 | 6/2012 | Sitti et al. | |
| 8,398,909 B1 | 3/2013 | Sitti et al. | |
| 8,524,092 B2 | 9/2013 | Sitti et al. | |
| 8,703,032 B2 | 4/2014 | Menon et al. | |
| 9,308,650 B2 | 4/2016 | Eisele et al. | |
| 9,340,708 B2 | 5/2016 | Sitti et al. | |
| 10,155,318 B2 | 12/2018 | Dadkhah et al. | |
| 10,363,668 B2 * | 7/2019 | Dadkhah Tehrani | B81C 1/00 |
| 2003/0084642 A1 | 5/2003 | Cheung et al. | |
| 2004/0102742 A1 | 5/2004 | Tuyl | |
| 2011/0286122 A1 | 11/2011 | Halpin et al. | |
| 2013/0236990 A1 | 9/2013 | Sato et al. | |
| 2013/0251937 A1 | 9/2013 | Sitti et al. | |
| 2013/0300812 A1 * | 11/2013 | Bibl | B25J 15/0052 347/159 |
| 2014/0227473 A1 | 8/2014 | Parness et al. | |
| 2014/0272272 A1 | 9/2014 | Spenko et al. | |
| 2014/0342394 A1 | 11/2014 | Parker et al. | |
| 2015/0368519 A1 | 12/2015 | Sitti et al. | |
| 2019/0001109 A1 * | 1/2019 | Kim | C09J 201/00 |
| 2019/0103357 A1 * | 4/2019 | Lim | H01L 25/105 |
| 2019/0118388 A1 | 4/2019 | Dadkhah Tehrani et al. | |
| 2019/0134368 A1 * | 5/2019 | Nagai | A61M 37/00 |
| 2019/0376864 A1 * | 12/2019 | Lukacs | G01L 9/0052 |

OTHER PUBLICATIONS

PCT/US2018/022994 International Search Report and Written Opinion dated Jul. 23, 2018.

U.S. Appl. No. 15/460,440 Notice of Allowance dated Oct. 15, 2018.

U.S. Appl. No. 16/174,583 Notice of Allowance dated Apr. 10, 2019.

\* cited by examiner

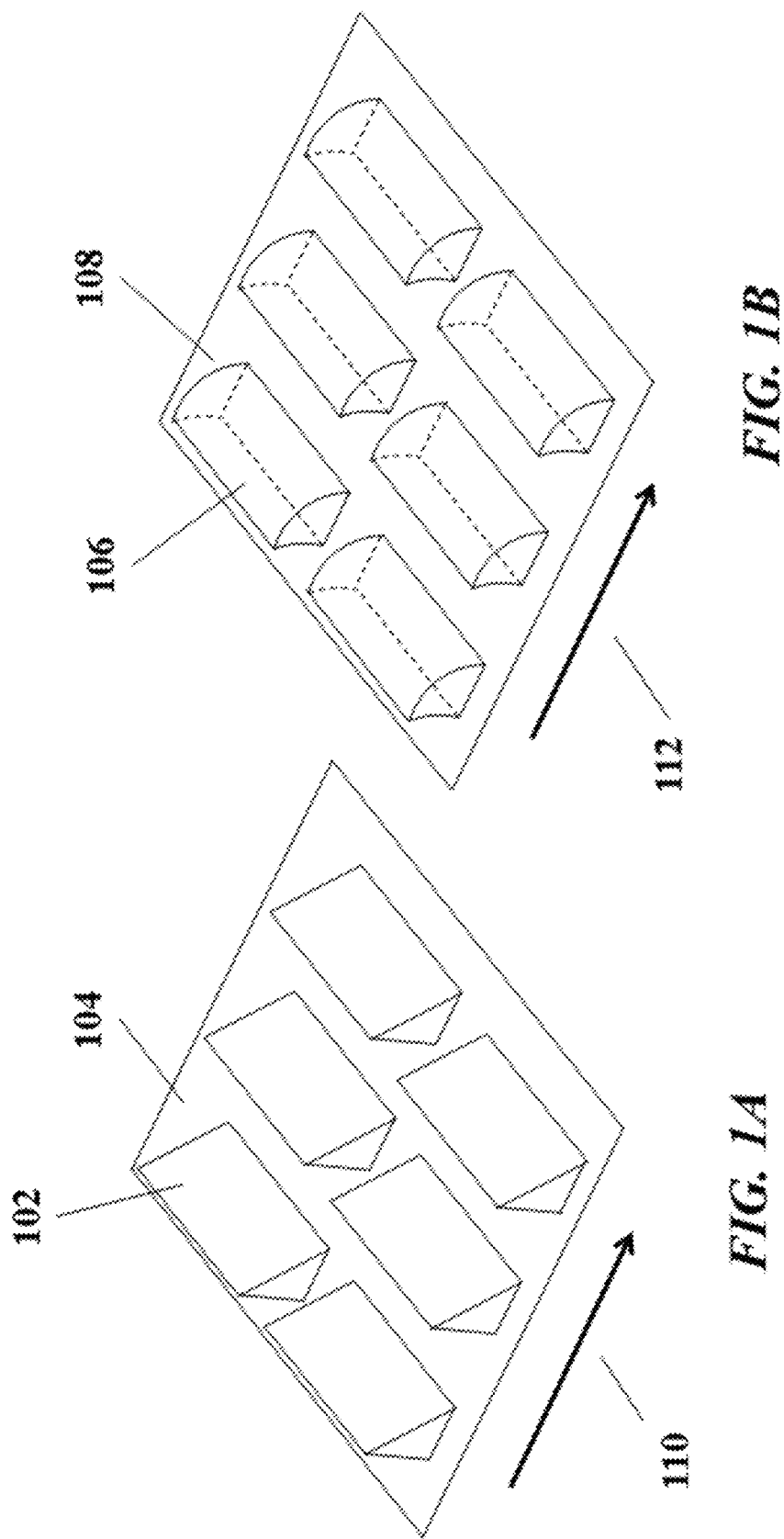

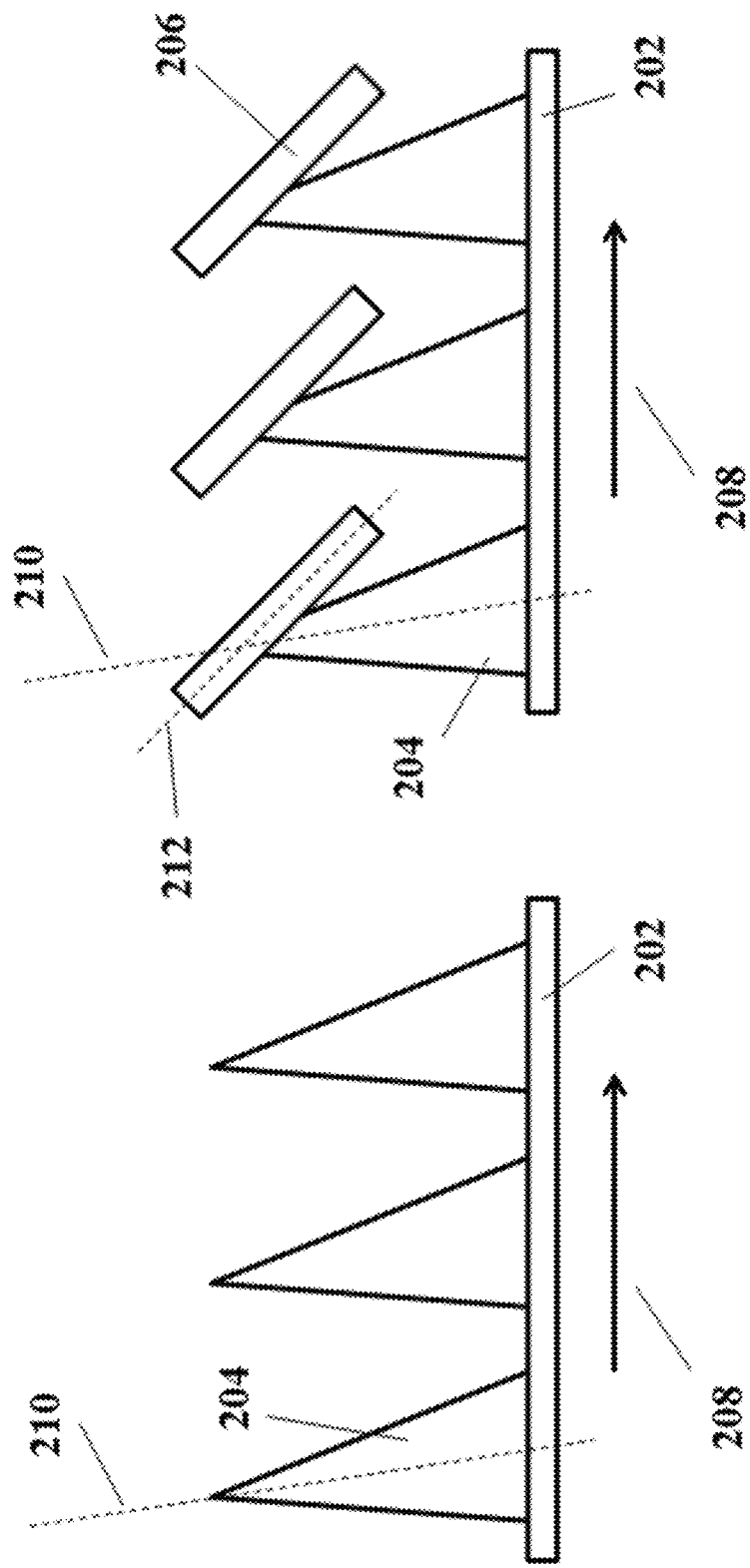

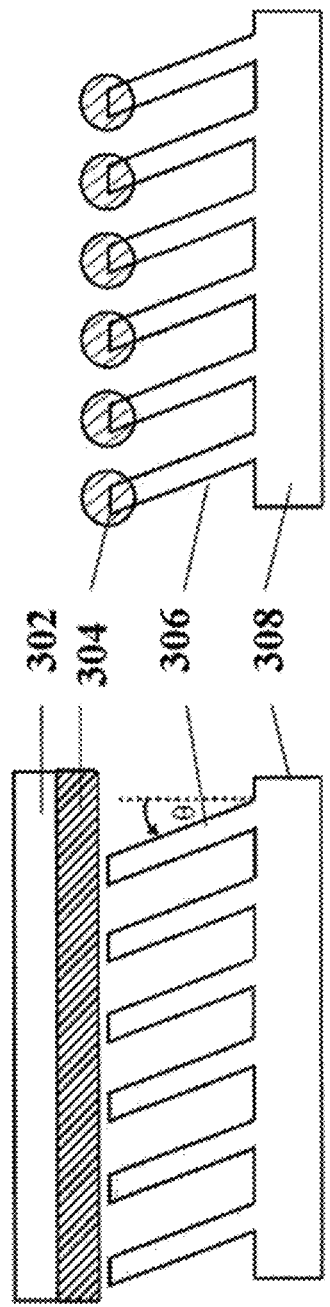
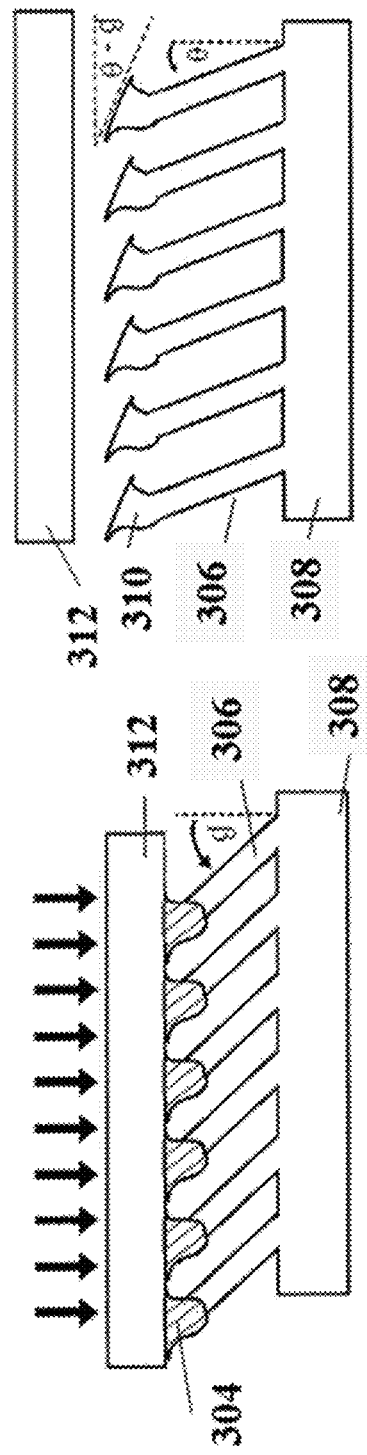

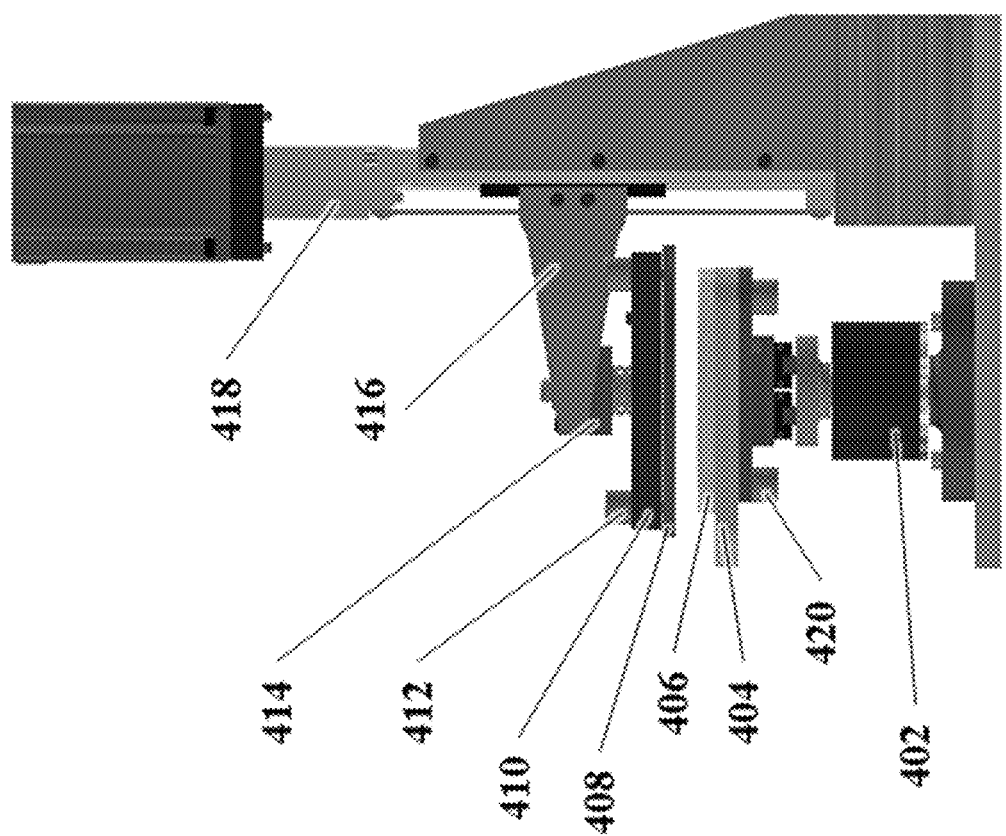

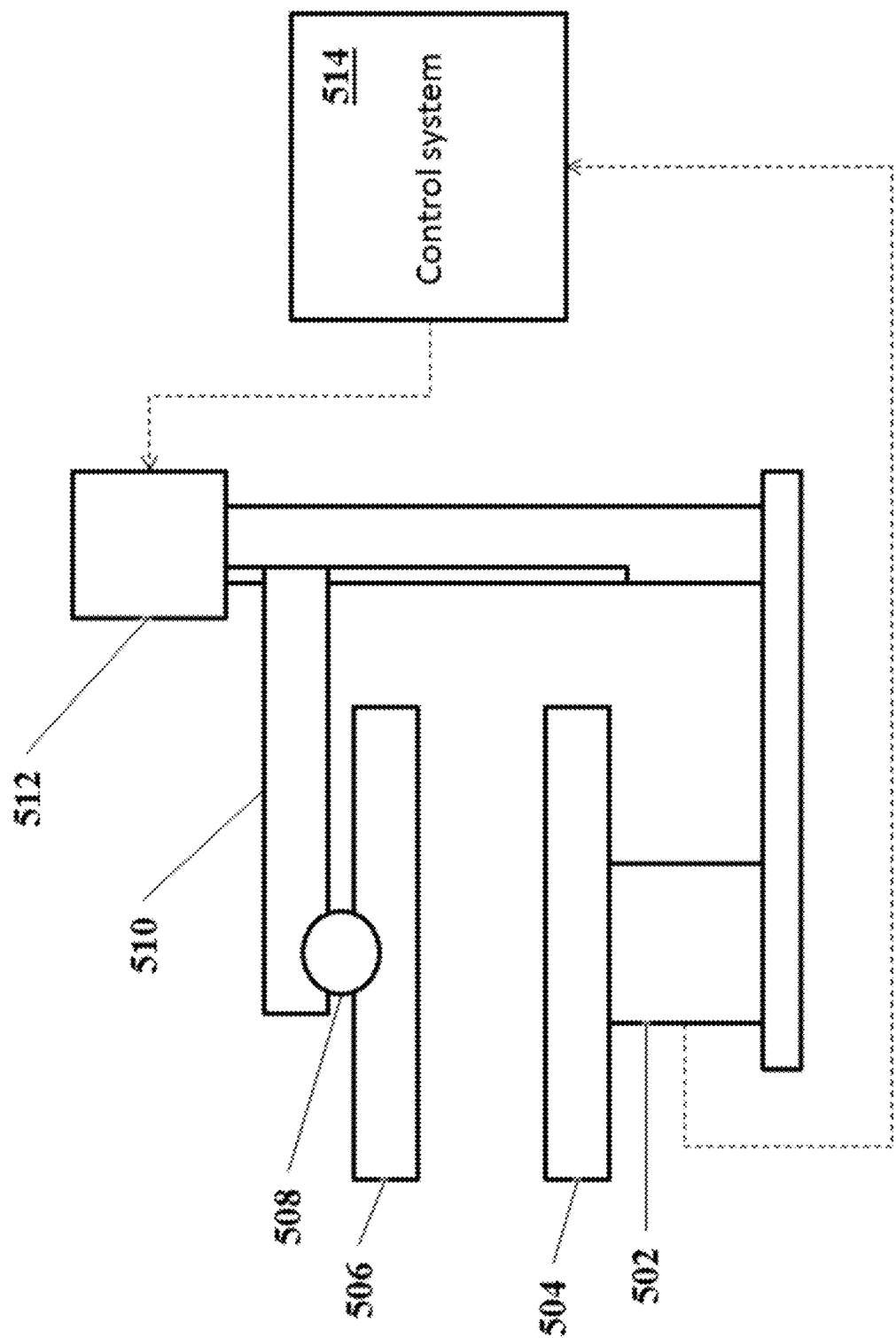

SYSTEMS AND METHODS FOR POST-TREATMENT OF DRY ADHESIVE MICROSTRUCTURES

CROSS-REFERENCE

This application is a continuation of U.S. patent application Ser. No. 16/174,583, filed Oct. 30, 2018, which is a divisional of U.S. patent application Ser. No. 15/460,440, filed Mar. 16, 2017, each of which applications is entirely incorporated herein by reference.

STATEMENT AS TO FEDERALLY SPONSORED RESEARCH

This invention was made with the support of the United States government under Contract number NNX16CP19C awarded by the National Aeronautics and Space Administration (NASA) Small Business Innovation Research (SBIR) program. The United States government has certain rights in the invention.

BACKGROUND

Artificial fibrillar microstructures have been shown to mimic the dry adhesive capabilities of micro-scale *setae* on the toes of the gecko lizard. In particular, individual fibrillar microstructures can be configured to conform to an adhering surface to improve real contact area and thereby increase attractive forces (e.g., intermolecular van der Waals forces) between the individual fibers and the contact surface. Dry adhesives, which are not dependent on liquid secretion, can adhere to and release from contact surfaces without leaving residue on the surfaces and with minimal contamination, allowing for repeated uses and longer lifetimes.

Physical characteristics and material properties of fibrillar microstructures can enhance or diminish their adhesive performance. For instance, synthetic fibrillar microstructures may be fabricated or post-treated to comprise tips having specific shapes, such as mushroom-like flaps, that can increase the real contact area between the individual fibers and the contact surface and significantly enhance the dry adhesive performance of these synthetic fibrillar microstructures. In another instance, the synthetic fibrillar microstructures may be fabricated or post-treated to comprise materials having different material properties. In some instances, different material properties, such as material conductivity, may allow for sensing systems to be integrated into the microstructures.

SUMMARY

Recognized herein are systems and methods for the post-treatment of dry adhesive microstructures that can improve adhesive performance. In some aspects, the microstructures can be post-treated to change physical characteristics, such as to comprise mushroom-like flaps. In other aspects, the microstructures can be post-treated, or initially fabricated, to comprise different materials. In some instances, microstructures comprising conductive material may be integrated into an engagement sensing system.

Provided is a method for post-treating dry adhesive microstructures to form post-treated tips. The method can comprise: directing a liquid polymer layer to self-align with a plurality of microstructures adjacent to a gripping surface; receiving, by a computer processor, a reading of applied pressure on said gripping surface by said liquid polymer layer; adjusting a position of said liquid polymer layer relative to a position of said gripping surface based at least in part on said reading of applied pressure and a predetermined dipping pressure; retracting said liquid polymer layer such that a portion of said liquid polymer layer is retained on a tip of each microstructure of said plurality of microstructures; and curing said portion of said liquid polymer layer.

In some embodiments, the computer processor can receive the reading of the applied pressure on the gripping surface by the liquid polymer layer and adjust the position of the liquid polymer layer in real-time.

In some embodiments, the curing can be performed while pressing the tip of each microstructure against a surface. The surface can be a hard surface.

In some embodiments, pressing the tip of each microstructure against the surface can comprise directing the surface to self-align with the plurality of microstructures. After self-alignment of the surface, the method can further comprise receiving, by the computer processor, a reading of applied pressure on the gripping pad by the surface, and adjusting a position of the surface using the reading of applied pressure on the gripping pad by the hard surface and a predetermined pressing pressure. The computer processor can receive the reading of the applied pressure on the gripping surface by the surface and adjust the position of the surface in real-time.

In some embodiments, the position of the gripping surface can be stationary throughout the method. For example, the gripping surface can be fixed in place, and either the liquid polymer layer or the surface, or both, can be moved relative to the stationary gripping surface.

In some embodiments, each microstructure of the plurality of microstructures can be oriented substantially along the same direction. For example, this can allow for directional control of the dry adhesives. In some embodiments, the microstructures of the plurality of microstructures can have parallel longitudinal axes, wherein the parallel longitudinal axes are oriented with respect to a normal of the gripping surface at an angle greater than zero degrees.

In some embodiments, each microstructure of the plurality of microstructures can include a first surface and a second surface, wherein the first surface has a greater surface area than the second surface. For example, each microstructure can be wedge-shaped.

In some embodiments, the plurality of microstructures and the liquid polymer layer can comprise the same elastomer. In some embodiments, the plurality of microstructures can comprise conductive additive(s). In some embodiments, the liquid polymer layer can comprise conductive additive(s).

In some embodiments, a given post-treated tip of the post-treated tips can comprise one or more flaps each projecting from a characteristic axis of the given post-treated tip. The characteristic axis of the given post-treated tip can be a longitudinal axis of the given post-treated tip.

In some embodiments, the one or more flaps can have parallel longitudinal axes, wherein the longitudinal axes are oriented with respect to a normal of the gripping surface at an angle greater than zero degrees. In some embodiments, the longitudinal axes of the one or more flaps can be non-parallel to longitudinal axes of the plurality of microstructures.

Provided is an apparatus for treating dry adhesive microstructures to form tips. The apparatus can comprise a plate comprising a gripping surface, wherein the gripping surface comprises a plurality of microstructures and an elevating plate having a first surface and a second surface opposite the first surface, wherein the first surface interfaces with the gripping surface and wherein the elevating plate is rotatable about a spherical joint coupled to the second surface. The apparatus can further comprise an arm having a proximal end and a distal end, wherein the distal end is coupled to the spherical joint and the proximal end is attached to a linear stage configured to move in an axis normal to a plane of the plate, a pressure sensor configured to measure applied pressure on the gripping surface by the elevating plate, and one or more computer processors operatively coupled to the pressure sensor and the linear stage, wherein the one or more computer processors are individually or collectively programmed to (i) receive from the pressure sensor readings of applied pressure, and (ii) use the readings of applied pressure and a predetermined pressure setting to adjust a position of the linear stage relative to a position of the plate.

In some embodiments, the elevating plate can be loaded with a liquid layer of uncured polymer. In some embodiments, the liquid layer of uncured polymer can comprise conductive additive(s). In some embodiments, the elevating plate can be a hard surface. In some embodiments, the elevating plate can be loaded with a separate hard surface.

In some embodiments, the first surface of the elevating plate can self-align to the gripping surface upon making contact.

In some embodiments, the one or more computer processors can adjust the position of the linear stage with micrometer accuracy. Alternatively, the computer processor can adjust the position of the linear stage with nanometer accuracy.

In some embodiments, a given tip of the tips formed from this apparatus can comprise one or more flaps each projecting from a characteristic axis of the given tip.

Provided is an integrated engagement sensing system in a gripping pad. An engagement sensing system can be integrated into a plurality of microstructures on a backing layer. The integrated engagement sensing system can comprise a backing layer comprising a first material having a first electrical conductivity, a plurality of microstructure stalks comprising a second material having a second electrical conductivity, wherein an end of each microstructure stalk of the plurality of microstructure stalks is coupled to the backing layer, and wherein each microstructure stalk is configured to couple to at least one neighboring microstructure stalk when the gripping surface is in an engaged state, and wherein the second electrical conductivity is higher than the first electrical conductivity, a plurality of sensing electrodes disposed on or adjacent to the backing layer, wherein any two sensing electrodes of the plurality of sensing electrodes are configured to measure voltage, and one or more computer processors operatively coupled to the plurality of sensing electrodes, wherein the one or more computer processors are individually or collectively programmed to (i) apply a current to the backing layer, (ii) receive a reading of the voltage, and (iii) based on the reading of the voltage, determine the engaged state of the gripping surface.

In some embodiments, a change in the reading of the voltage can be indicative of the engaged state.

In some embodiments, the current can be direct current, and the engaged state can be determined when each microstructure stalk contacts at least one neighboring microstructure stalk. In some embodiments, the current can be an alternating current, and the engaged state can be determined when each microstructure stalk achieves near contact with at least one neighboring microstructure stalk.

In some embodiments, the second electrical conductivity can be at least one or more magnitudes higher than the first electrical conductivity.

In some embodiments, the one or more computer processors can be individually or collectively programmed to perform a mechanical action on the gripping surface based at least in part on the engaged state. In some instances, the mechanical action can be an application or release of shear load. In some instances, the mechanical action can be an application or release of pre-load.

In some embodiments, each microstructure stalk of the plurality of microstructure stalks can include a first surface and a second surface, wherein the first surface has a greater surface area than the second surface. In some embodiments, each microstructure stalk of the plurality of microstructure stalks can comprise post-treated tips.

Provided is a method for sensing engagement of a gripping surface. The method can comprise: applying a current to a backing layer of a gripping surface, wherein an end of each microstructure stalk of a plurality of microstructure stalks is attached to the backing layer; measuring a voltage or current between a first reference point and a second reference point, wherein the first and second reference points are located on the backing layer; opening a conductive pathway between the first and second reference points through the plurality of microstructure stalks, wherein each microstructure stalk is coupled to at least one neighboring microstructure stalk when the gripping surface is in an engaged state and wherein the plurality of microstructure stalks has a higher conductivity than the backing layer; and determining, from a change in the voltage or current, the engaged state of the gripping surface.

In some embodiments, a change in the reading of the voltage or current can be indicative of an engaged state.

In some embodiments, the plurality of microstructure stalks can have an electrical conductivity at least one or more magnitudes higher than an electrical conductivity of the backing layer.

In some embodiments, the current can be direct current, and the engaged state can be determined when each microstructure stalk contacts at least one neighboring microstructure stalk. In some embodiments, the current can be an alternating current, and the engaged state can be determined when each microstructure stalk achieves near contact with at least one neighboring microstructure stalk.

In some embodiments, the method can further comprise performing a mechanical action on the gripping surface based at least in part on the engaged state. The mechanical action can be an application or release of shear load. The mechanical action can be an application or release of pre-load.

In some embodiments, each microstructure stalk of the plurality of microstructure stalks can include a first surface and a second surface, wherein the first surface has a greater surface area than the second surface.

In some embodiments, each microstructure stalk of the plurality of microstructure stalks can comprise post-treated tips.

In another aspect, provided is a system for manipulating an object. The system can comprise a backing layer, a plurality of microstructure stalks protruding from the backing layer, wherein a given microstructure stalk of the plurality of microstructure stalks comprises material doped with at least one conductive additive, and one or more flaps projecting from a characteristic axis of each of the plurality of microstructure stalks, which one or more flaps are separate from the plurality of microstructure stalks.

In some embodiments, at least one conductive additive can comprise a carbon nanotube. In some embodiments, at least one conductive additive can comprise carbon black.

In some embodiments, at least one conductive additive can protrude from an outer surface of the given microstructure stalk as asperities. In some embodiments, at least one conductive additive can protrudes from the outer surface as an asperity.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIG. 1A illustrates a perspective view of exemplary microstructures on a surface of a gripping pad in an unloaded state.

FIG. 1B illustrates a perspective view of exemplary microstructures on a surface of a gripping pad in a loaded state.

FIG. 2A shows a cross-sectional front view of pre-treatment microstructures on a surface of a gripping pad.

FIG. 2B shows a cross-sectional front view of post-treatment microstructures on a surface of a gripping pad.

FIGS. 3A-D illustrate a dipping process that adds mushroom-like flaps to the tip of each dry adhesive microstructure stalk. FIG. 3A shows a first step, FIG. 3B shows a second step, FIG. 3C shows a third step, and FIG. 3D shows a fourth step.

FIG. 4A shows a post-treatment apparatus in a relaxed position.

FIG. 5 shows a block diagram of the post-treatment apparatus with a control system.

DETAILED DESCRIPTION

Figure 2C:
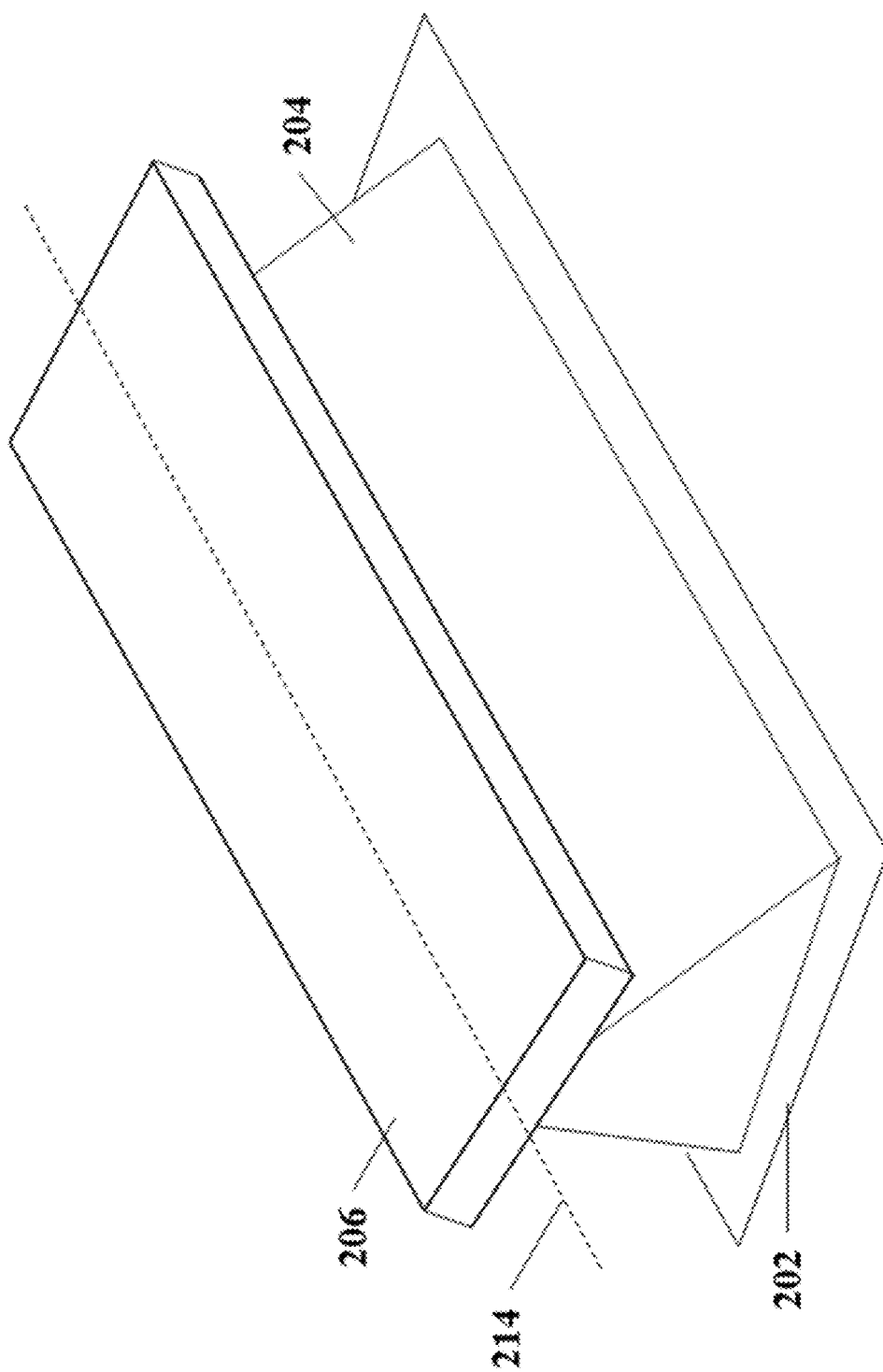
FIG. 2C can be a perspective view of a post-treatment microstructure on a surface of a gripping pad.

The present disclosure provides systems and methods for the post-treatment of dry adhesive microstructures. In some aspects, a change in physical characteristics, such as a shape, size, or volume, of microstructures in a dry adhesive may affect the degree of van der Waals interactions between the microstructures and a contact surface to enhance or diminish overall adhesive performance. As such, the microstructures may be post-treated to change one or more physical characteristics to improve adhesive performance. For example, the microstructures may be post-treated to comprise mushroom-like flaps at their tips to interface with the contact surface. An increased contact area at the interface can increase attractive forces (e.g., van der Waals interactions). In some aspects, a change in material composition of the microstructures in a dry adhesive may affect mechanical properties, such as work of adhesion and modulus of elasticity (e.g., Young's modulus), of the dry adhesive to enhance or diminish overall adhesive performance. For example, conductive additives can be added to the material to improve adhesive performance. In other aspects, microstructures comprising conductive material may allow for pre-load engagement sensing systems to be integrated into the microstructures.

The term "elastomer" in the descriptions herein, refers to a material that changes properties in response to an applied force. Elastomers, in various formulations, respond to normal forces, compression, torque, or sheer stresses or forces. Some elastomers are also referred to as "rubber," "polymer," or "silicone." Typically, but not always, an elastomer responds to an applied force with a physical deformation. Additionally, elastomers can be designed to change various properties such as impedance in response to applied force, stress, or torque. Elastomers can be configured to change properties when stressed in one dimension, or in multiple dimensions.

Elastomers can be formulated and produced with various properties that may be desirable for a given application, for example desired flexibility, stiffness (i.e. spring constant or dimensional change in response to pressure), conformability (i.e. ability to follow a curved or complex contour), thickness, color, or electrical or heat conductivity. Another property of an elastomer is "durometer," which is its hardness or resistance to permanent deformation.

Microstructures having different physical characteristics, such as in shape, size, and/or volume, can comprise different adhesive properties. In some aspects, physical characteristics, such as a shape, size, or volume, of microstructures in a dry adhesive may affect the degree of van der Waals interactions between the microstructures and a contact surface to enhance or diminish overall adhesive performance. The microstructures may be post-treated to change one or more physical characteristics to improve adhesive performance.

FIG. 1A illustrates a perspective view of exemplary microstructures on a surface of a gripping pad in an unloaded state. FIG. 1A is not drawn to scale. A plurality of microstructures 102 may populate a surface 104 of a gripping pad or any other surface intended for adhesion. The surface 104 can represent a sample portion of a larger surface intended for adhesion. Surfaces comprising microstructures, such as the surface 104, may also be referred to as backing layers. A microstructure stalk may comprise two ends, a first end rooted in the backing layer and a second end, such as a tip of the stalk, extending longitudinally away from the backing layer. The tip of a microstructure stalk may be pointed. Alternatively the tip of a microstructure stalk may be flat, rounded, or comprise a more complex pattern. Each of the microstructures 102 may comprise substantially uniform geometric structures. For example, FIG. 1A shows an array of uniform wedge-like microstructures wherein the cross-sectional front view of each microstructure is triangular (see FIG. 2A) with a base rooted on the surface 104 and a tip extending longitudinally away from the surface 104. Alternatively, the microstructures 102 may comprise conical, cylindrical, cubical, trapezoidal, or other more complex geometric structures with similar or different cross-sectional shapes.

The microstructures 102 can have micro-scale dimensions. For instance, a microstructure can have a maximum dimension of less than about 300, 250, 200, 150, 140, 130, 120, 110, 100, 90, 80, 70, 60, 50, 45, 40, 35, 30, 25, 20, 15, 10, 9, 8, 7, 6, 5 µm. A maximum dimension of the microstructure may be a dimension of the microstructure (e.g., length, width, height, altitude, diameter, etc.) that is greater than the other dimensions of the microstructure. In one example, the wedge-like microstructure can have a dimension of about 60 µm in height, 20 µm in width, and 200 µm in length. In some instances, each of the microstructures 102 may be laid out on the surface 104 in an evenly-spaced array or a grid-like pattern. For example, an edge of the base of each microstructure 102 may be separated from the closest edge of the base of a neighboring microstructure by a distance of about 20-40 In other instances, each of the microstructures 102 may be laid out in an arbitrary pattern with non-uniform gaps between each microstructure.

Directional control, wherein the gripping surface comprising the microstructures 102 is configured to adhere to a contact surface when a shear load is applied in a preferred direction 110 and detach when the shear load is relaxed, can be achieved by orienting each microstructure 102 in substantially the same direction on the surface 104. The tip, or a characteristic axis (e.g., axis 210 in FIG. 2A), of each microstructure can be configured to tilt away from the preferred direction 110 of shear load. The characteristic axis can be a longitudinal axis. In the unloaded state, as in FIG. 1A, the tips of the wedge-like microstructure 102 allow only for minimal contact area between the microstructures and a contact surface, which allows for relatively low Van der waals interactions and therefore low adhesive performance. When a shear load is applied to the microstructures 102 in the preferred direction 110, the microstructures 102 can conform, or bend, against the contact surface, as in FIG. 1B (contact surface not shown), in a direction opposite the preferred direction 110 such that the contact area between the microstructures and the contact surface significantly increases, which allows for relatively high Van der waals interactions and therefore higher adhesive performance. When the shear load is relaxed, the microstructures 102 can revert to the initial unloaded state, as in FIG. 1A. The microstructures 102 may comprise a compliant material (e.g., elastomers) that can withstand repeated structural conformations between the unloaded state and the loaded state. The materials comprising the microstructures will be discussed further below.

FIG. 1B illustrates a perspective view of exemplary microstructures on a surface of a gripping pad in a loaded state. FIG. 1B is not drawn to scale. A plurality of microstructures 106 may populate a surface 108 of a gripping pad or any other surface intended for adhesion. In the loaded state, as described above, a shear load is applied in a preferred direction 112 which bends the microstructures 106 against a contact surface (not shown in FIG. 1B) in a direction opposite the preferred direction 112, increasing the real contact area between the microstructures 106 and the contact surface. A wedge-like structure, with an extended length along an axis, may provide increased contact area along the extended length. In some instances, the surfaces 104 and 108 can be the same surface, the preferred directions 110 and 112 can be the same direction, and the microstructures 102 and 106 may represent the same microstructures in an unloaded state and a loaded state, respectively.

The dry adhesive performance of these microstructures can be significantly enhanced through a post-treatment process that reconfigures the respective tips of each microstructure to add a mushroom-like flap to the tip of each fiber. During a loaded state of the microstructures, the mushroom-like flap may provide increased contact area between the microstructures and the contact surface.

FIG. 2A shows a cross-sectional front view of pre-treatment microstructures on a surface of a gripping pad and FIG. 2B shows a cross-sectional front view of post-treatment microstructures on a surface of a gripping pad. In FIG. 2A, a plurality of pre-treatment wedge-shaped microstructures 204 populate a surface 202 of a gripping pad or any other surface intended for adhesion. The surface 202 can represent a sample portion of a larger surface intended for adhesion. Each of the microstructures 204 has a longitudinal axis 210 tilting away from a preferred direction 208 of shear load. In some instances, FIG. 2A can be a cross-sectional front view of FIG. 1A.

FIG. 2B shows the wedge-shaped microstructures 204 comprising post-treatment tips 206 that resemble mushroom-like flaps. The longitudinal axis 212 of each post-treatment tip can tilt away from the preferred direction 208 at a larger angle than the longitudinal axis 210 of the microstructures 204. FIG. 2C can be a perspective view of a microstructure in FIG. 2B. The post-treatment tips 206 can comprise a substantially flat surface with a latitudinal axis 214 substantially parallel to the surface 202. In a loaded state, beneficially, the added surface area of the post-treatment tips 206 can bend against a contact surface (not shown in FIGS. 2A and 2B) in a direction opposite to the preferred direction 208 and provide a larger contact area between the microstructures and the contact surface. The larger contact area can produce greater attractive forces (e.g., higher Van der Waals interactions) and improve the adhesive performance of the gripping surface. FIGS. 2A-C are not drawn to scale.

The post-treatment tips can be fabricated through a dipping process. FIGS. 3A-D, in the order of FIG. 3A to FIG. 3B to FIG. 3C to FIG. 3D, illustrate a dipping process that adds mushroom-like flaps 310 to the tips of each of the dry adhesive microstructure stalks 306. In FIG. 3A, a backing layer 308 surface of a gripping pad, or other surface intended for adhesion, comprises a plurality of microstructure stalks 306. A thin layer of uncured liquid polymer 304 is formed, such as through high-speed spin coating techniques, and carried on a substrate (e.g., glass wafer) 302. The liquid polymer layer 304 is aligned to face, at some distance above, the tips of the microstructure stalks 306. The liquid polymer layer 304 can be aligned such that it is parallel, or substantially parallel, to the backing layer 308. In some instances, the uncured liquid polymer 304 can comprise the same elastomer as that the microstructure stalks 306 comprise. In other instances, the uncured liquid polymer 304 can comprise different materials than those the microstructure stalks 306 comprise.

Next, in FIG. 3B, the tips of the microstructures 306 are dipped into the liquid polymer layer 304. In some instances, the liquid polymer layer 304 can be brought down towards the microstructure stalks 306. Alternatively, the microstructure stalks 306 can be brought upward towards the liquid polymer layer 304. Alternatively, both the microstructure stalks 306 and the liquid layer 304 can be brought towards the other. After dipping, the microstructure stalks 306 are retracted from the liquid polymer layer 304, or the liquid polymer layer 304 is retracted from the microstructure stalks 306, and each microstructure stalk 306 retains some amount of the uncured liquid polymer 304 at its tip. Next, in FIG. 3C, the tips of the microstructure stalks 306 are brought into contact with a hard surface 312 (e.g., glass wafer) such that the uncured liquid polymer 304 is pressed against the hard surface 312. The hard surface 312 may be parallel, or substantially parallel, to the backing layer 308 and be sufficiently hard to withstand the pressing of the tips without deformation. The uncured polymer 304 on the tips of the microstructures 306 may be cured while being pressed, under a constant load, against the hard surface 312. Next, in FIG. 3D, the cured microstructures can be peeled from the hard surface 312 to result in the microstructures 306 comprising the mushroom-like flaps 310. The magnitude of the constant load during the pressing step may be varied to vary the resulting tilting angle (e.g., angle between the longitudinal axes 210 and 212 in FIG. 2B) of the post-treatment tips.

The post-treatment process of FIGS. 3A-3D may alternatively have the microstructure stalks 306 positioned on top with the tips facing downwards and the liquid polymer layer 304 and the hard surface 312 positioned below the microstructure stalks 306.

As described above, the post-treatment tip manufacturing process can require the precise alignment of different surfaces (e.g., gripping pad, uncured layer of liquid polymer, hard surface) as well as the application of a constant and precise load during the dipping and pressing stages. An applied weight dipping strategy can be subject to the individual skills and experiences of an operator or technician, and repeated processes may yield non-uniform batches. Provided are systems and methods that can automate the manufacturing process and enable the mass manufacture of uniform yields of post-treated dry adhesive microstructures. The method can apply a hard-stop based dipping strategy in place of the applied weight method.

Figure 4B:
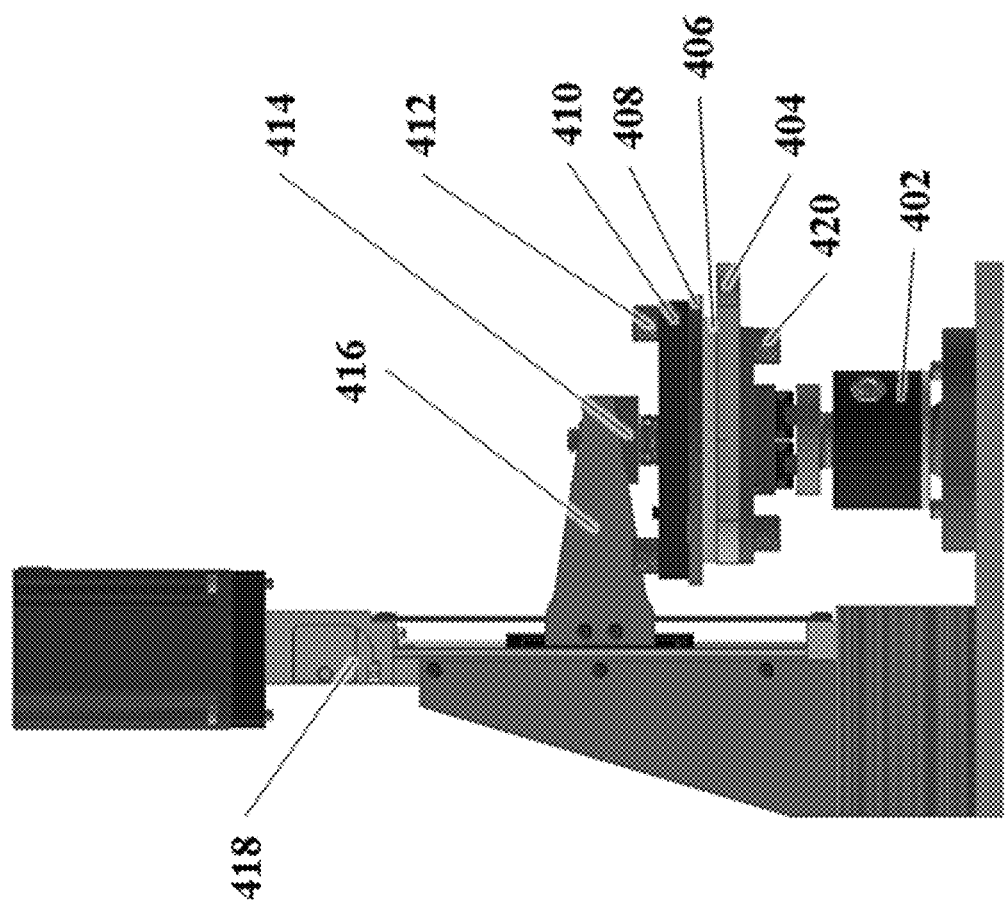
FIG. 4B shows a post-treatment apparatus in a pressure applying position.

FIGS. 4A and 4B show examples of a post-treatment apparatus. FIG. 4A shows the apparatus in a relaxed position and FIG. 4B shows the apparatus in a pressure applying position. The post-treatment apparatus may comprise a stationary wafer 406 and an elevating wafer 408. Alternatively, the post-treatment apparatus may comprise a stationary plate and an elevating plate. The stationary wafer 406 and elevating wafer 408 may be glass wafers. The stationary wafer 406 may be fixed in place to a base plate 404 by a first set of thumb screws 420. The first set of thumb screws 420 may comprise any number (e.g., 1, 2, 3, 4, 5, 6, 7, 8, 9, 10, etc.) of thumb screws placed around the periphery of the stationary wafer 406. A thumb screw may be a screw configured to rotate clockwise or counterclockwise around an axis, wherein a rotation in one direction can perform a locking action and a rotation in the other direction can perform an unlocking action. The thumb screw may comprise a cap which an operator, or a control system, of the apparatus, by hand or by tool, can grip and rotate. For example, loosening one or more screws 420, in either a clockwise or counterclockwise direction, can unlock and release the stationary wafer 406 from the base plate 404, and tightening one or more screws 420, in an opposite direction, can lock the stationary wafer 406 in place to the base plate 404. Alternatively, the same locking and unlocking actions can be achieved through interfaces other than thumb screws (e.g., bolts, switches, levers, magnets, hatches, etc.). Similarly, the elevating wafer 408 may be fixed in place, such as to a top plate 410, by a second set of thumb screws 412 which operate in the same manner as the first set of thumb screws 420. For example, loosening one or more screws 412, in either a clockwise or counterclockwise direction, can unlock and release the elevating wafer 408 from the top plate 410, and tightening one or more screws 412, in an opposite direction, can lock the elevating wafer 408 in place to the top plate 410. The stationary wafer 406 and the elevating wafer 408 may be conveniently loaded and unloaded by loosening and tightening the thumb screws 412, 420.

During the post-treatment process, a gripping pad comprising dry adhesive microstructures may be placed on the stationary wafer 406 such that the tips of the microstructures are facing up. The base plate 404 carrying the stationary wafer 406 may be placed above a load cell 402. The load cell 402 can be configured to measure the applied pressure on the gripping pad, such as applied by the elevating wafer 408, during the post-treatment process and transmit the applied pressure readings to a control system (not shown in FIGS. 4A and 4B). The initial position of the stationary wafer 406 relative to the load cell 402 can be maintained via retaining springs. In some instances, the load cell 402 can be replaced by other pressure or force sensors.

An elevating arm 416 may comprise a proximal end and a distal end. The top plate 410 may be connected to the distal end of the elevating arm 416 via a spherical joint 414. The top plate 410, and the elevating wafer 408 fixed to the top plate 410, may rotate about the spherical joint 414. In some instances, the spherical joint 414 may comprise a ball swivel that allows rotational movement in one, two or three degrees of freedom. For example, the elevating wafer 408 may be configured to change roll, pitch, and yaw about the spherical joint 414. In another example, the elevating wafer 408 may be configured to change only roll and pitch, only roll and yaw, or only pitch and yaw about the spherical joint 414. In another example, the elevating wafer 408 may be configured to change only roll, only pitch, or only yaw.

The proximal end of the elevating arm 416 can be attached to a motorized linear stage 418, and the elevating arm 416 can be configured to move in an axis (e.g., z-axis) normal to the plane of the stationary wafer. The motorized linear stage 418 can be a linear potentiometer. The motorized linear stage 418 may operate on a stepper motor. The same control system receiving the load cell readings may transmit instructions to the stepper motor of the motorized linear stage 418. Through the control system, during the post-treatment process, the elevating wafer 408, and constituents thereon, may be systematically driven into the gripping pad on the stationary wafer 406 by the motorized linear stage 416 with micrometer accuracy. For example, the control system may alternate the apparatus between a relaxed position, as in FIG. 4A, and a pressure applying position, as in FIG. 4B. The control system may further control the degree of pressure applied in the pressure applying position. In some instances, the control system may control the motorized linear stage 416 with nanometer accuracy.

In some instances, the elevating arm 416 can be configured to move non-linearly (e.g., arcuate, curved, freeform). For example, the elevating arm 416 may move in other axes (e.g., x-axis, y-axis, z-axis) or in an arcuate line.

Because the height and/or altitude of the microstructures on the gripping pad can be about 100 μm, the precise and accurate alignment of the elevating wafer 408 and the gripping pad on the stationary wafer 406 can be important.

Beneficially, the elevating wafer 408 may self-align itself to the stationary wafer. The elevating wafer 408 may rotate about the spherical joint 414 until the elevating wafer 408 comes into contact with the gripping pad on the stationary wafer 406, upon which the elevating wafer 408 can self-align itself to the surface of the gripping pad. In some instances, a bottom surface of the elevating wafer 408 may comprise a thin layer of uncured polymer (e.g., liquid polymer layer 304 in FIG. 3A) to which the microstructures on the gripping pad is dipped into. In some instances, the elevating wafer may comprise a hard surface (e.g., hard surface 312 in FIG. 3C) against which the microstructure stalks are pressed and the uncured polymer on their tips are cured. The elevating wafer 408 may be loaded or unloaded from the apparatus by tightening and/or loosening the thumb screws 412.

FIG. 5 shows a block diagram of the post-treatment apparatus with a control system. The post-treatment apparatus may comprise a stationary wafer 504 and an elevating wafer 506. The stationary wafer 504, on which a gripping pad can be placed, can be positioned above a load cell 502. The initial position of the stationary wafer 504 relative to the load cell 502 can be maintained via retaining springs. The elevating wafer 506 can be connected to an elevating arm 510 via a spherical joint 508. The elevating wafer 506 may rotate (e.g., yaw, pitch, roll) about the spherical joint 508. In some instances, the elevating wafer 506 may be connected to the spherical joint 508 at its center of gravity. In other instances, the elevating wafer 506 may be connected to the spherical joint 508 at a different location in which the elevating wafer 506 can obtain a substantially parallel position to the stationary wafer 504 in its freedom of movement. The elevating arm 510 may be attached to a motorized linear stage 512 and be capable of moving linearly along an axis normal to the plane of the stationary wafer 504.

The control system 514 may be configured to receive load cell 502 readings and control the position of the motorized linear stage 512 with micrometer accuracy, based on a desired pressure setting and the load cell 502 readings on the gripping pad. In some instances, the control system 514 may be configured to control the position of the motorized linear stage 512 with nanometer accuracy. For example, the control system 514 may comprise a first microcontroller (e.g., Arduino® Uno) communicatively coupled to the load cell 502 to receive readings of applied load on the gripping pad, a second microcontroller communicatively coupled to a stepper motor to control the position of the motorized linear stage 512, and a graphical user interface (e.g., LCD display) communicatively coupled to the first and/or second microcontrollers. Alternatively, the control system 514 may comprise a single microcontroller to perform both functions of the first and second microcontrollers. Alternatively or in addition, the control system 514 may comprise one or more computer processors. Alternatively or in addition, the control system 514 may comprise a different type of user interface or a display to enhance user control. The control system 514 may communicate (e.g., transmit instructions) with the motorized linear stage 512 via wired or wireless (e.g., wireless networks, Bluetooth, Wi-Fi, etc.) connections. The control system 514 may communicate (e.g., receive readings) with the load cell 502 via wired or wireless connections.

In some instances, the post-treatment apparatus may further comprise a heating system to facilitate the curing of the liquid polymer on the tips of the microstructures during pressing. The heating system may comprise a heating element and a temperature sensor. For example, the heating element can be a heating film (e.g., Polyimide Flexible Adhesive Thermo Foil Heating Film). Alternatively, the heating element can be any other element that can conduct heat (e.g., heating pad, heating coil, etc.) or radiate heat (e.g., UV light). The heating element (e.g., heating film) can be attached to a heat conducting plate (e.g., copper plate). A surface of the heat conducting plate can be attached to (e.g., stacked in direct contact with) a surface of the elevating wafer 506 (e.g., glass wafer). For example, the heat conducting plate can be placed between the elevating wafer 408 and the top plate 410 in FIGS. 4A and 4B. Beneficially, the heat conducting plate can evenly distribute heat on the elevating wafer 408. The temperature sensor can be a thermistor. The temperature sensor can be nested inside the heat conducting plate. In some instances, the temperature sensor can be placed near the center (e.g., on a lateral surface, in a depth, etc.) of the heat conducting plate. In some instances, the temperature sensor can be nested closer to the elevating wafer 408. When heat is applied by the heating element during curing, the temperature sensor can measure the temperature of the heating plate, which can be a good indicator of the curing temperature—the temperature of the copper can be higher than the tele temperature of the elevating wafer 408.

The control system 514 (in FIG. 5) may be configured to receive temperature sensor readings and control the heat applied by the heating element, based on a desired temperature setting and the temperature sensor readings on the heating plate. The desired temperature setting can be a desired curing temperature. For example, the curing temperature can be adjustable up to 220° C. Alternatively, the curing temperature can be lower or higher. The control system 514 may communicate (e.g., transmit instructions) with the heating element via wired or wireless (e.g., wireless networks, Bluetooth, Wi-Fi, etc.) connections. The control system 514 may communicate (e.g., receive readings) with the temperature sensor via wired or wireless connections.

For instance, if the load cell 502 readings received by the control system 514 are less than a desired pressure, the control system 514 may transmit instructions to the motorized linear stage 512 to adjust the elevating arm 510 to a lower position to apply more pressure on the gripping pad. In contrast, if the load cell 502 readings received by the control system 514 are greater than the desired pressure, the control system 514 may transmit instructions to the motorized linear stage 512 to adjust the elevating arm 510 to a higher position to alleviate the pressure from the gripping pad. If the load cell 502 readings received by the control system 514 are within an acceptable error range (e.g., within a micrometer, a tenth of a micrometer, a hundredth of a micrometer, a nanometer, etc.) of the desired pressure, the control system 514 may transmit instructions to the motorized linear stage 512 to maintain the elevating arm 510 at the current position. The control system 514 may receive and transmit data and/or instructions in real time. Real-time can include a response time of less than 1 second, tenths of a second, hundredths of a second, or a millisecond. That is, the control system 514 may apply, maintain, or adjust a specified applied pressure in real-time. In some instances, the load cell 502 can be replaced by other force or pressure sensors that are communicatively coupled to the control system 514. The control system 514 may receive applied pressure readings from a load cell or any other force or pressure sensors.

Figure 6:
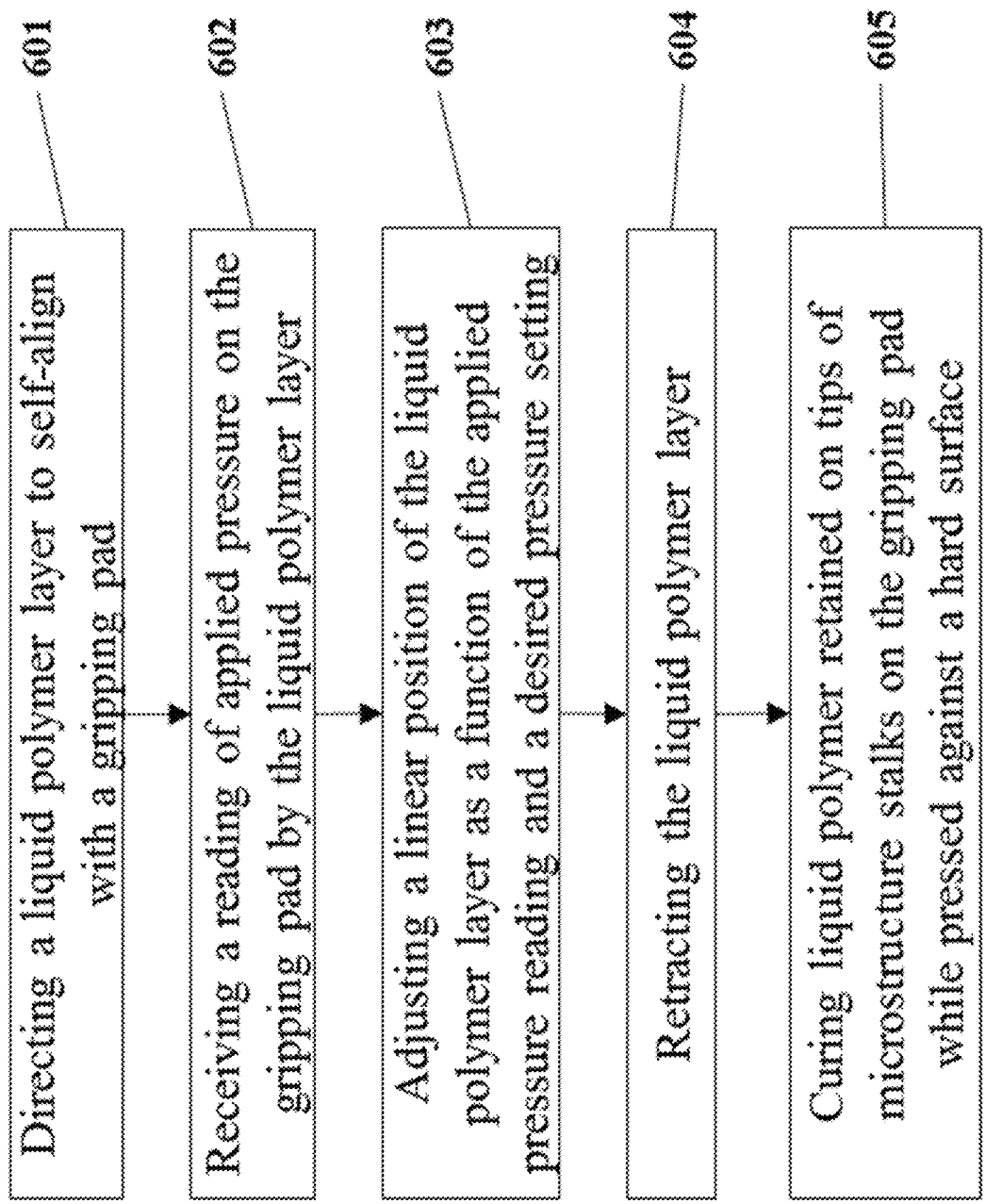
FIG. 6 illustrates a method for the post-treatment of dry adhesive microstructures.

FIG. 6 illustrates a method for the post-treatment of dry adhesive microstructures. Each microstructure stalk may comprise two ends, a first end rooted in the surface of a gripping pad (e.g., backing layer) and a second end extending longitudinally away from the surface. The microstructures may be directional or non-directional. The microstructures may comprise symmetrical or asymmetrical structures and/or cross-sections. For example, the microstructures may comprise a wedge-shaped geometric structure. Alternatively, the microstructures may comprise conical, cylindrical, cubical, trapezoidal, or other more complex geometric structures. The microstructures may be of relatively uniform height with micro-scale dimensions. For instance, a microstructure can have a maximum height and/or altitude of less than about 100, 90, 80, 70, 60, 50, 45, 40, 35, 30, 25, 20, 15, 10, 9, 8, 7, 6, 5 μm. In one example, a wedge-like microstructure can have a dimension of about 60 μm in height, 20 μm in width, and 200 μm in length.

The method may comprise, at a first step 601, directing a liquid polymer layer to self-align itself with a gripping pad. For example, a first surface of an elevating wafer can be directed to self-align with a surface of the gripping pad, wherein the first surface of the elevating wafer is coated with a thin layer of uncured liquid polymer, and wherein the thin layer of uncured liquid polymer is facing the microstructure stalks on the gripping pad. The elevating wafer can self-align to the gripping pad by initially having some amount of rotational freedom (e.g., pitch, roll, yaw) about a fixed point on a second surface of the elevating wafer which is opposite the first surface and gradually losing such amount of rotational freedom as the contact area between the first surface of the elevating wafer and the microstructure stalks on the gripping pad increases. For example, the elevating wafer may rotate about a spherical joint on the second surface. In some instances, the elevating wafer may begin to self-align itself to the gripping pad when at least an area on the first surface of the elevating wafer comes into contact with one or more microstructure stalks on the gripping pad. Beneficially, this self-alignment can provide even dipping of the uncured liquid polymer on the tips of each microstructure stalk on the gripping pad. Linearly driving a misaligned elevating wafer into the gripping pad may, for example, result in heavier dipping of a plurality of microstructure stalks in one region of the gripping pad and lighter, or no, dipping of a plurality of microstructures stalks in another region of the gripping pad.

In a next step 602, a control system may receive a reading of applied pressure on the gripping pad by the liquid polymer layer. In some instances, the applied pressure reading may be transmitted to the control system by a load cell placed below the gripping pad. Alternatively, the applied pressure reading may be transmitted to the control system by other force or pressure sensors.

In the next step 603, the control system may, based on the reading of the applied pressure and a desired pressure setting, adjust a linear position of the elevating wafer relative to the position of the stationary wafer to maintain, increase, or decrease the applied pressure on the gripping pad. The desired pressure setting may vary depending on desired parameters or desired products of the dipping process (e.g., desired length of microstructure tip dipped, amount of uncured polymer retained on tip when elevating wafer is retracted, etc.). For example, for a microstructure stalk with a height of about 100 μm, the desired pressure setting can be configured to dip the stalk between 25 μm to 100 nm in 1 μm increments, 0.5 μm increments, 0.1 μm, 0.01 μm, or 1 nm in the uncured liquid polymer layer. The control system may receive applied pressure readings in real-time and provide instructions to adjust the linear position of the elevated wafer in real-time. In some instances, the elevating wafer can be configured to move non-linearly (e.g., arcuate, curved, freeform). For example, the position of the elevating wafer can be adjusted relative to the stationary wafer in any coordinates (e.g., Cartesian coordinates, polar coordinates, etc.).

After dipping under the desired pressure setting, in the next step 604, the elevating wafer can be retracted such that the microstructure stalks retain some amount of uncured liquid polymer on their tips. In a next step 605, the microstructure stalks can be cured while the tips with the uncured liquid polymer are pressed against a hard surface. The hard surface can be removed after curing to yield the microstructure stalks comprising post-treatment tips resembling mushroom-like flaps.

Figure 7:
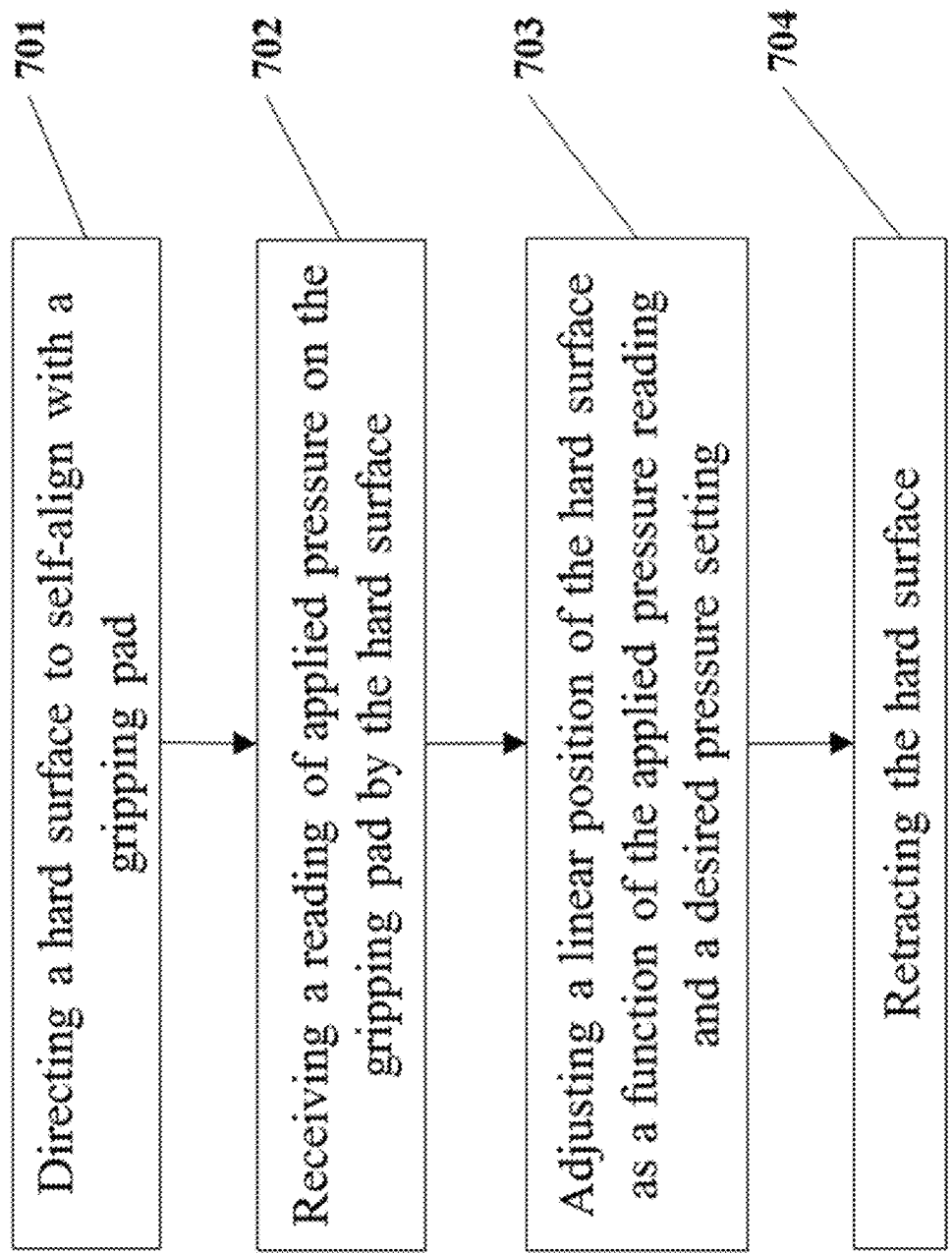
FIG. 7 illustrates a curing process.

In some instances, the curing process may comprise the same self-aligning process and pressure control system as the dipping process, as shown in FIG. 7. For instance, the method may further comprise directing 701 the hard surface to self-align with the gripping pad. The self-alignment of the hard surface to the gripping pad may be similar to the self-alignment of the liquid polymer layer to the gripping pad. Beneficially, this self-alignment can provide even pressing of the uncured liquid polymer on the tips of each microstructure stalk on the gripping pad against the hard surface. Pressing against a misaligned hard surface may, for example, result in the formation of post-treatment tips on the microstructure stalks at uneven angles (e.g., tilt of longitudinal axis 212 relative to tilt of longitudinal axis 210 in FIG. 2B) or post-treatment tips with uneven shapes (e.g., flatness or curvature of mushroom like flaps, etc.) across the surface of the gripping pad.

During pressing and curing, the control system may receive 702 a reading of applied pressure on the gripping pad by the hard surface. The applied pressure reading may be transmitted to the control system by a load cell placed below the gripping pad. The control system may, based on the reading of the applied pressure and a desired pressure setting for the pressing stage, adjust 703 a linear position of the hard surface to maintain, increase, or decrease the applied pressure on the gripping pad. The desired pressure setting may vary depending on desired parameters of the post-treatment tips (e.g., desired surface area of mushroom-like flap, desired angle of tilt of the post-treatment tips relative to the microstructure stalk, etc.). The control system may receive applied pressure readings in real-time and provide instructions to adjust the linear position of the hard surface in real-time.

After the uncured liquid polymer is cured on the microstructures, the hard surface can be retracted 704. One or more steps of the methods described above may be performed using the aforementioned post-treatment apparatus (e.g., described with FIGS. 4 and 5). Alternatively, the methods above may be performed, individually or collectively, through use of other devices, tools, and/or manual labor.

In some aspects, material composition of the microstructures in a dry adhesive may affect mechanical properties, such as work of adhesion and modulus of elasticity (i.e., Young's modulus), of the adhesive to enhance or diminish overall adhesive performance.

The dry adhesive microstructures may comprise, in part or in whole, a conductive material. In some instances, the microstructures may comprise a high-conductivity elastomer. In other instances, the microstructures may comprise an elastomer doped with conductive additives. Materials comprising conductive additives may, among other changes effected, improve in electrical conductivity, tensile strength, hardness, and elastic modulus characteristics. Some conductive additives include carbon nanotubes (CNTs) and carbon black. Generally, because an increase in modulus of elasticity translates to an increase in adhesive performance, the addition of conductive additives to the microstructures will increase the elastic modulus and thereby increase normal adhesion pressure.

In some instances, microstructures stalks (such as the microstructures 204 in FIG. 2A) may be fabricated with material (e.g., elastomer) doped with conductive additives such as carbon nanotubes and carbon black. The microstructures comprising conductive additives, wholly or in part, may increase normal adhesion pressure and improve adhesive performance. Additionally, conductive additives may also alter the geometry of the stalks. For example, during a curing process, conductive additives (e.g., carbon nanotubes) can protrude from an outer surface of the stalks as asperities, which can also impact the adhesion pressure and improve adhesive performance.

Alternatively or in addition, the material forming post-treatment tips (such as the tips 212 in FIG. 2B) of the microstructures, such as the liquid layer of uncured polymer 304 in FIG. 3A-3C, may be doped with conductive additives. The microstructures comprising conductive additives, wholly or in part, may increase normal adhesion pressure and improve adhesive performance.

In other aspects, microstructures comprising conductive material may provide an integrated pre-load engagement sensing system.

Figure 8:
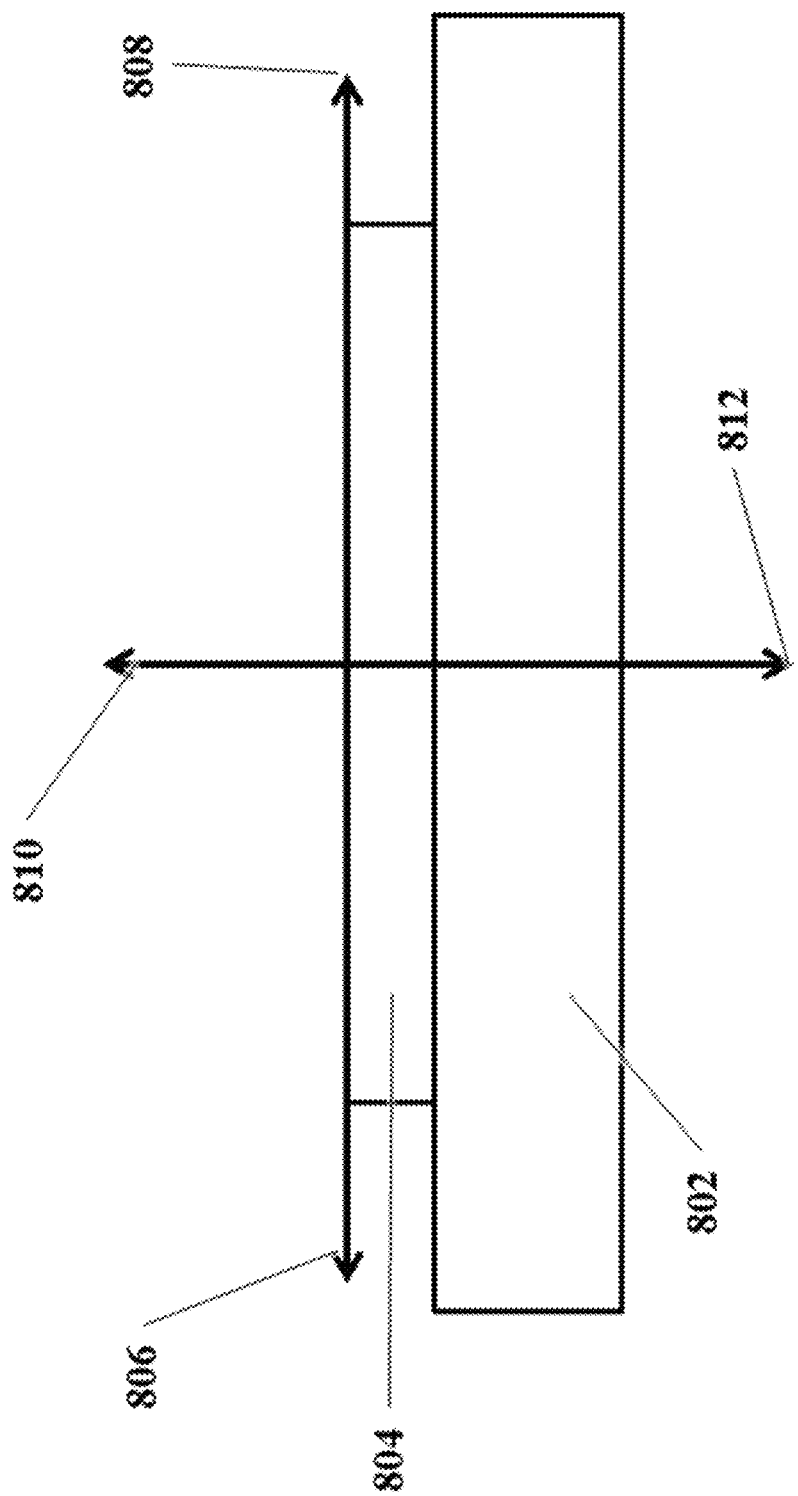
FIG. 8 shows a schematic force diagram of a gripping pad.

FIG. 8 shows a schematic force diagram of a gripping pad. When a gripping pad 804 is placed on a surface 802, wherein the tips of the microstructures on the gripping pad 804 are interfacing with the surface 802, there are three characteristic forces acting on the pad: a preload force 812, an adhesion force 812, and a shear force 806, 808. The gripping pad 804 can be any surface, comprising a plurality of microstructures, intended for adhesion. The surface 802 can be any surface the gripping pad 804 is intended to grip (e.g., wall, object, etc.). A preload force 812 and a shear force 806 can be considered activation forces and the adhesion force 812 can be the force produced, and the force intended, when the gripping pad 804 is activated. In some instances, a shear force 806 in a preferred direction can be an activation force and a shear force 808 in a direction opposite the preferred direction can be a deactivation force.

An adequate preload force 812 must be applied at each gripping pad 804 to ensure that the gripping pad 804 is engaged when shear loads (e.g., producing the shear forces 806) are applied to the gripping pad 804. The preload force 812 can be a force on the gripping pad 804 oriented towards the surface 812. The resulting adhesion force 810 can be a force oriented away from the surface 812. In some instances, the preload, shear, and/or adhesion forces can be individual or collective forces acting on or resulting from individual microstructures on the gripping pad 804.

The microstructures on the surface of a gripping pad 804 may not always completely engage when shear loading is applied. Without adequate engagement, the microstructures on the surface of the gripping pad 804 may not sufficiently conform, or bend, against the surface 802 (as in the microstructures 106 in the loaded state in FIG. 1B) when a shear force 806 is applied. It is therefore beneficial to be able to detect or sense a state of pre-load engagement or a lack thereof. Provided are systems and methods for sensing pre-load engagement of microstructures on a gripping pad.

Figure 9A:
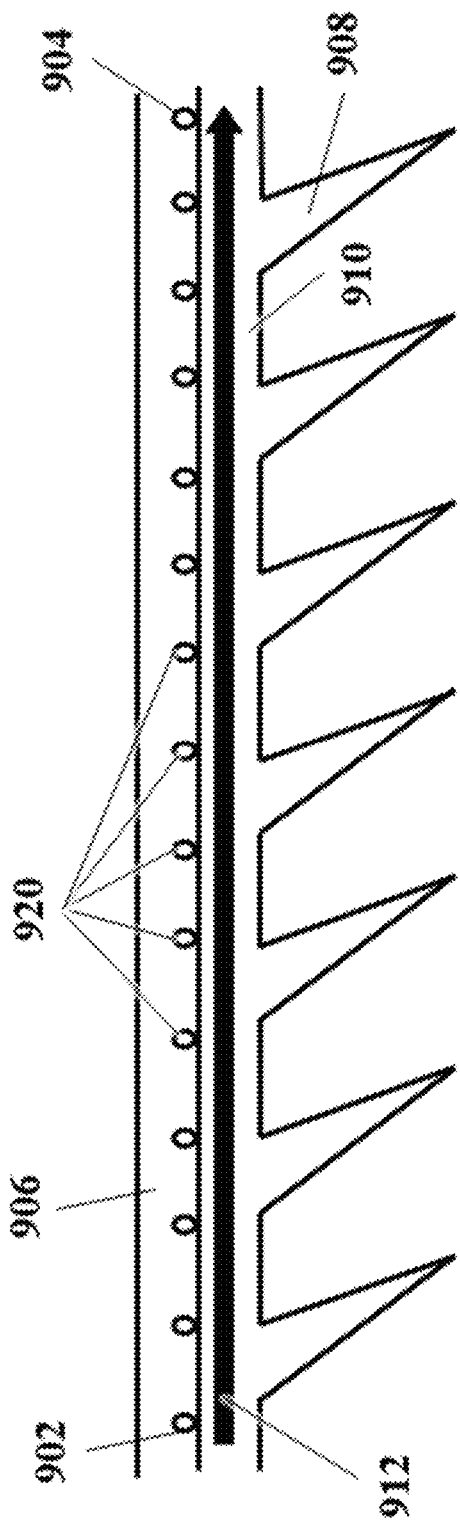
FIG. 9A shows a cross-sectional front view of a plurality of wedge-shaped microstructure stalks stemming from a backing layer in an unengaged state.
Figure 9B:
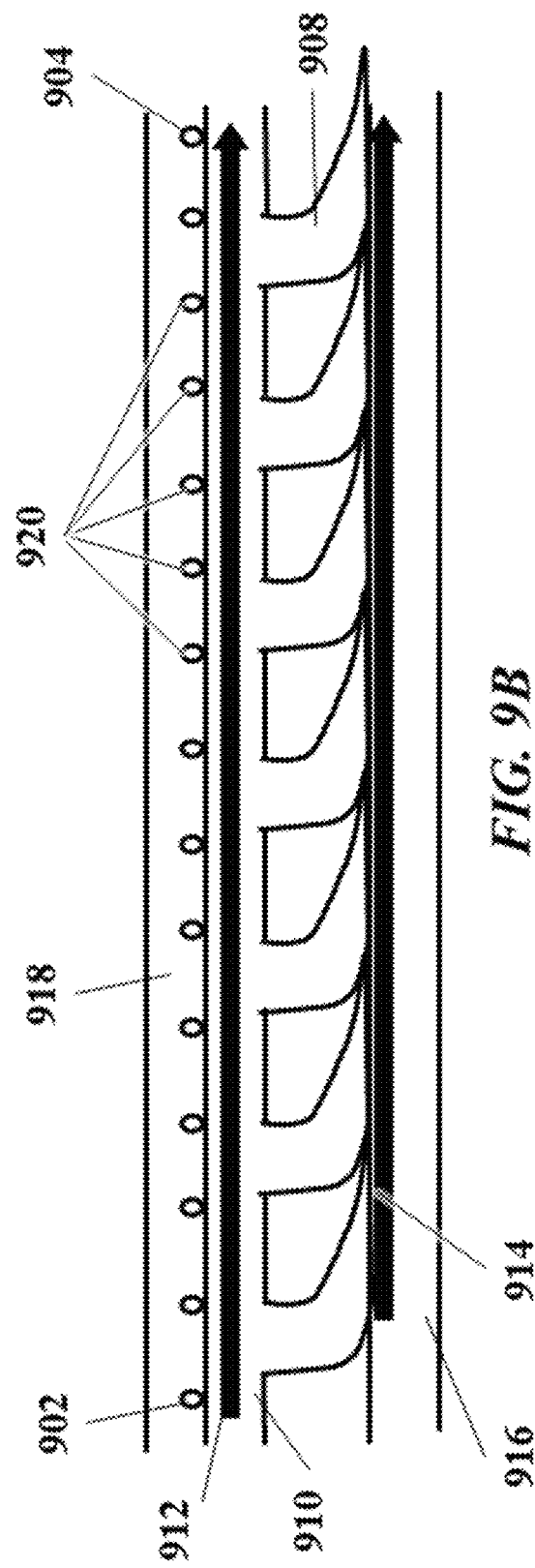
FIG. 9B shows a cross-sectional front view of the plurality of wedge-shaped microstructure stalks in an engaged state.

The sensing element can be integrated into the microstructures themselves. FIGS. 9A and 9B show integrated engagement sensing systems in an unengaged state and an engaged state, respectively. FIGS. 9A and 9B are not drawn to scale. While FIGS. 9A and 9B show exemplary wedge-shaped microstructures, as a person of ordinary skill in the art will recognize, the sensing systems may comprise microstructures of different geometric structures.

FIG. 9A shows a cross-sectional front view of a plurality of wedge-shaped microstructure stalks 908 stemming from a backing layer 910 in an unengaged state. The microstructure stalks 908 and backing layer 910 can be cast out of two layers of conductive material (e.g., elastomer) atop a printed circuit board 906. The printed circuit board 906 can be parallel to the plane of the backing layer 910. The printed circuit board 906 can comprise a power channel 902, a ground channel 904 and multiple sensing channels 920. A plurality of sensing channels 920 may be spaced out through the plane of the circuit board 906. In some instances, each of the sensing channels 920 may be positioned on the circuit board 906 in an evenly-spaced array or a grid-like pattern. In other instances, each of the sensing channels 920 may be laid out in an arbitrary pattern with non-uniform gaps between each channel. In some instances, each of the sensing channels 920 may be positioned on one or more key reference locations. A sensing channel 920 can be an electrode.

The microstructure stalks 908 and backing layer 910 may each comprise a material of different conductivity. For example, the microstructure stalks 908 may comprise a material several orders of magnitude more conductive than the material of the backing layer 910. The microstructure stalks 908 can comprise a high conductivity elastomer and the backing layer 910 can comprise a low conductivity elastomer. In some instances, such high conductivity elastomer can have a resistivity from about 0.0001 Ohm-cm and 100 Ohm-cm, or 0.001 Ohm-cm and 10 Ohm-cm. In some instances, such low-conductivity elastomer can have a resistivity from about 10 Ohm-cm and 100 kOhm-cm, or 100 Ohm-cm and 10 kOhm-cm.

Engagement of the microstructures 908 may be detected or sensed by letting a current flow through the backing layer 910 and measuring a voltage or current between two reference channels 920. The current applied can be an alternating current (AC) or a direct current (DC). The current can be applied through the power channel 902. Alternatively, the current can be applied through other electrodes. Because the backing layer 910 comprises a low conductivity material, the current has a path of high resistivity 912 through the backing layer 910. When the microstructures are not engaged (as in FIG. 9A), the high conductivity stalks 908 are isolated from one another and the high resistivity path 912 is the only path available to the current to reach one or more sensing channels 920 on the backing layer 912. Thus, when the dry adhesive is unengaged, no change in voltage or current is measured.

For a given current applied through the power 902 electrode, the measured voltage from the sensing electrodes 920 can decrease the closer they are to the ground 904, assuming a uniformly conductive elastomer.

FIG. 9B shows a cross-sectional front view of the plurality of wedge-shaped microstructure stalks 908 in an engaged state against the surface 916. The surface 916 can be any surface that the microstructure stalks 908 are intended to grip, such as the surfaces of walls or those of objects.

When the microstructures are engaged, in some instances, the high conductivity stalks 908 can make contact with one another, as illustrated in FIG. 9B, opening conductive pathways through the high conductivity stalks 908. For example, when a DC voltage, or current, is applied, there can be an increased current flow through the contacting stalks 908 which is a significantly less resistive path 914 than the high resistivity path 912 which runs through the backing layer 910. Because the current can flow through the less resistive path 914, voltage measurement will drop. In some instances, voltage can be measured between the ground 904 channel and a sensing channel 920. In other instances, voltage can be measured between any two sensing channels 920.

In some cases, an AC voltage, or current, can be applied. When the microstructures are engaged, in some instances, the high conductivity stalks 908 may not necessarily make direct contact with one another. For example, the stalks 908 may make, or achieve, near contact with one another. When the high conductivity stalks move closer together, a change in impedance can be measured due to a change in capacitance.

Figure 10:
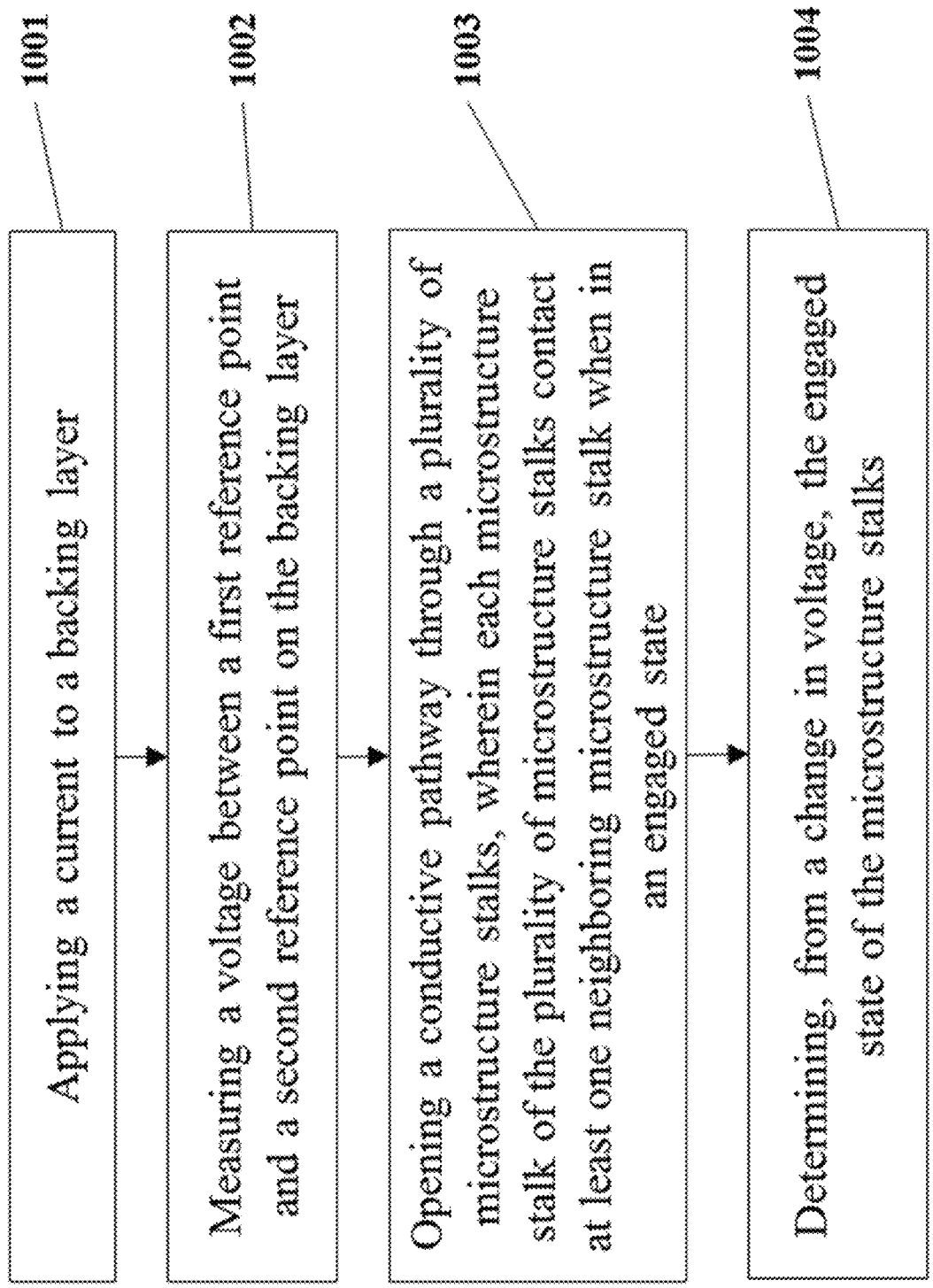
FIG. 10 illustrates a method for sensing engagement.

Thus, a state of engagement or lack of engagement of an adhesive comprising the microstructures can be sensed by configuring the microstructures to provide conductive pathways in an engaged state and measuring changes in voltage. FIG. 10 shows a method for sensing engagement. The method may comprise, at a first step 1001, applying a current to a backing layer. The backing layer may comprise a plurality of microstructures. At a next step 1002, the voltage between a first reference point and a second reference point on the backing layer can be measured. Either the first reference point or the second reference point can be the ground 904 channel. At a next step 1003, a conductive pathway for the current can be opened through a plurality of microstructure stalks, wherein each microstructure stalk of the plurality of microstructure stalks contacts at least one neighboring microstructure stalk in an engaged state. At a next step 1004, an engaged state, or lack of engaged state, can be determined from a change in voltage, or lack of change in voltage, respectively.

In some instances, the electronics for these sensing mechanisms can operate at the periphery of a gripping pad comprising the microstructures so as to not interfere with the operation of other electrostatic elements that can be included in the gripping pad.

In some instances, the integrated engagement sensing system can operate in conjunction with other sensing systems (e.g., optical sensing systems, auditory sensing systems, tactical sensing systems, electrostatic sensing systems, etc.) that can sense different objects or different activities. One or more other sensing systems can be integrated into the gripping pad. Alternatively or in addition, one or more other sensing systems can be located remotely to or external to the gripping pad.

Figure 11:
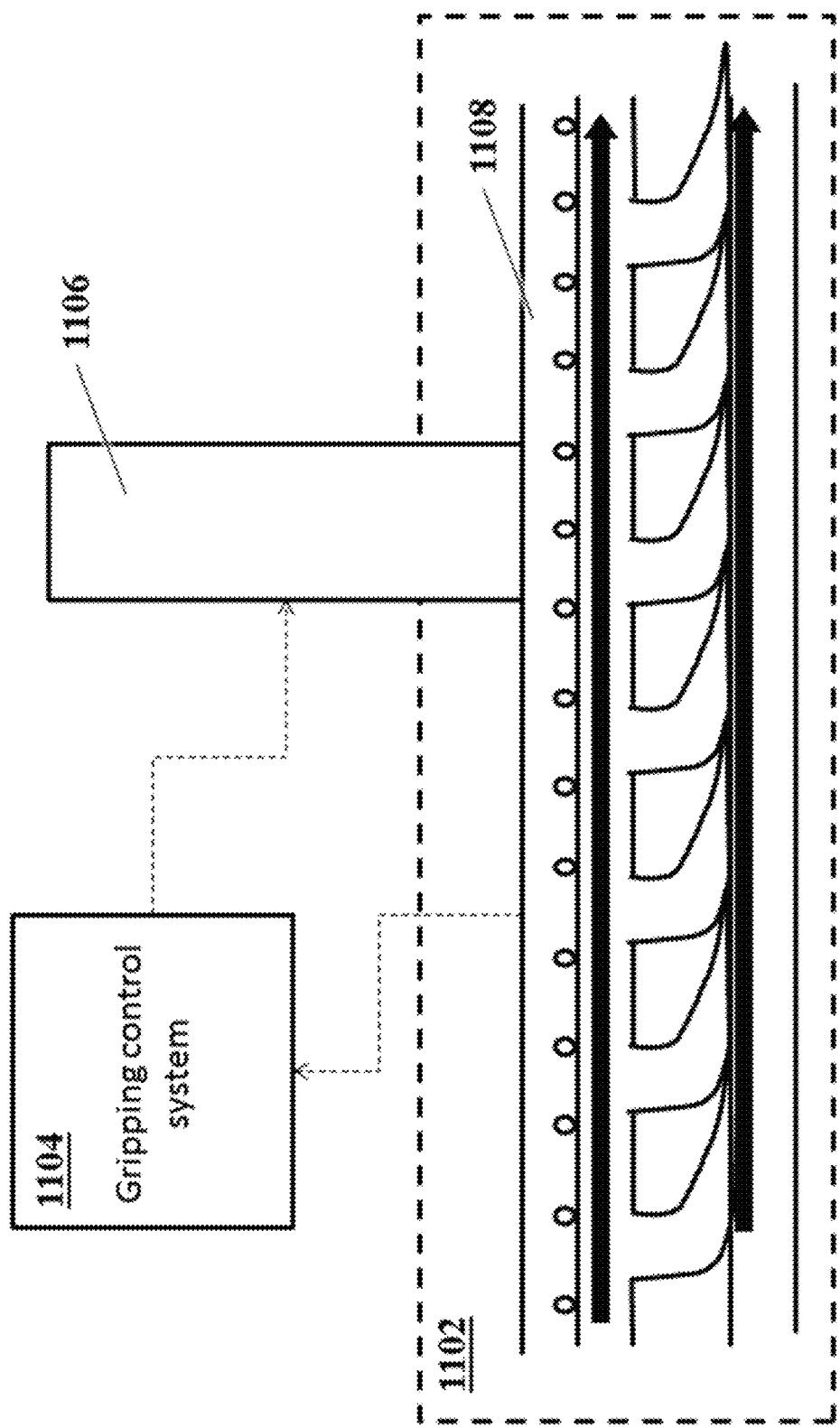
FIG. 11 shows a schematic diagram of a gripping control system.

FIG. 11 shows a gripping control system. Sensor data from a gripping pad 1102 or constituents thereon, such as a circuit board 1108, such as voltage readings or other sensor measurements, can be transmitted to a gripping control system 1104. The gripping control system 1104 may comprise one or more microcontrollers. Alternatively or in addition, the gripping control system 1104 may comprise one or more computer processors. In some instances, the gripping control system may control mechanics 1106 of a gripping system. The mechanics 1106 of a gripping system can include a mechanical application or release of shear load, a mechanical application or release of pre-load, a mechanical positioning of a gripping pad 1102 on a surface (e.g., object, wall, etc.), a mechanical rotation of the gripping pad 1102, and other mechanical performances. Such mechanical performances can be effectuated by actuators, motors, joints, arms, fasteners, and other mechanical systems. The gripping control system 1104 may interpret sensor data to determine a state of engagement. In some instances, the gripping control system 1104 may, based on a determination of a state of engagement, direct mechanics 1106 of the gripping system, such as to apply or release a shear load (e.g., via an actuator).

The gripping control system 1104 may communicate (e.g., transmit, receive instructions) with the gripping pad 1102 via wired or wireless (e.g., wireless networks, Bluetooth, Wi-Fi, etc.) connections. The gripping control system 1104 may communicate (e.g., transmit, receive instructions) with the mechanics 1106 of the gripping pad 1102 via wired or wireless connections.

The present disclosure provides control systems that are programmed to implement systems and methods of the disclosure. For example, a computer system is programmed or otherwise configured to perform the functions of various control systems described above, such as the control system 514 in FIG. 5 and the gripping control system 1104 in FIG. 11. In some instances, there may be a separate computer system communicating with the control systems described herein. In some instances, the computer system can comprise one or more microprocessors. Alternatively or in addition, the computer system can comprise one or more microcontrollers. The computer system can be an electronic device of a user (e.g., operator, technician, controller, engineer, etc.) or a computer system that is remotely located with respect to the electronic device. The electronic device can be a mobile electronic device.

The computer system includes a central processing unit (CPU, also "processor" and "computer processor" herein), which can be a single core or multi core processor, or a plurality of processors for parallel processing. The computer system also includes memory or memory location (e.g., random-access memory, read-only memory, flash memory), electronic storage unit (e.g., hard disk), communication interface (e.g., network adapter) for communicating with one or more other systems (e.g., other computer systems, mechanical systems, gripping systems, etc.), and peripheral devices, such as cache, other memory, data storage and/or electronic display adapters. The memory, storage unit, communication interface and peripheral devices are in communication with the CPU through a communication bus (solid lines), such as a motherboard. The storage unit can be a data storage unit (or data repository) for storing data. The computer system can be operatively coupled to a computer network ("network") with the aid of the communication interface. The network can be the Internet, an internet and/or extranet, or an intranet and/or extranet that is in communication with the Internet. The network in some cases is a telecommunication and/or data network. The computer network can include one or more computer servers, which can enable distributed computing, such as cloud computing. The network, in some cases with the aid of the computer system, can implement a peer-to-peer network, which may enable devices coupled to the computer system to behave as a client or a server.

The CPU can execute a sequence of machine-readable instructions, which can be embodied in a program or software. The instructions may be stored in a memory location, such as the memory. The instructions can be directed to the CPU, which can subsequently program or otherwise configure the CPU to implement systems and methods of the present disclosure. Examples of operations performed by the CPU can include fetch, decode, execute, and writeback.

The CPU can be part of a circuit, such as an integrated circuit. One or more other components of the system can be included in the circuit. In some cases, the circuit is an application specific integrated circuit (ASIC).

The storage unit can store files, such as drivers, libraries and saved programs. The storage unit can store user data (e.g., user preferences, user programs, machine default settings). The computer system in some cases can include one or more additional data storage units that are external to the computer system, such as located on a remote server that is in communication with the computer system through an intranet or the Internet.

The computer system (e.g., control system 514, gripping control system 1104) can communicate with one or more remote computer systems through the network. For instance, the computer system can communicate with a remote computer system of a user (e.g., lab technician, robot controller, etc.). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system via the computer network.

Methods as described herein can be implemented by way of machine (e.g., computer processor) executable code stored on an electronic storage location of the computer system, such as, for example, on the memory or electronic storage unit. The machine executable or machine readable code can be provided in the form of software. During use, the code can be executed by the processor. In some cases, the code can be retrieved from the storage unit and stored on the memory for ready access by the processor. In some situations, the electronic storage unit can be precluded, and machine-executable instructions are stored on memory.

The code can be pre-compiled and configured for use with a machine having a processor adapted to execute the code, or can be compiled during runtime. The code can be supplied in a programming language that can be selected to enable the code to execute in a pre-compiled or as-compiled fashion.

Aspects of the systems and methods provided herein can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system can include or be in communication with an electronic display (e.g., LED) that comprises a user interface (UI) for providing, for example, sensor data readings (e.g., applied pressure readings, voltage readings, etc.), timers, dry adhesive engagement status updates, available mechanical actions. Examples of UI's include, without limitation, a graphical user interface (GUI) and web-based user interface.

Methods and systems of the present disclosure can be implemented by way of one or more algorithms. An algorithm can be implemented by way of software upon execution by the central processing unit. The algorithm can, for example, receive and transmit commands, interpret applied pressure readings, determine and direct a linear position of a pressure applying wafer based on the applied pressure readings and a desired pressure reading, interpret a voltage measurement, determine an adhesive's engagement status from such voltage measurements, and direct and control one or more mechanics of a gripping system.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. An integrated engagement sensing system in a gripping surface, comprising:
    a backing layer comprising a first material having a first electrical conductivity;
    a plurality of microstructure stalks comprising a second material having a second electrical conductivity, wherein an end of each microstructure stalk of said plurality of microstructure stalks is coupled to said backing layer, and wherein each microstructure stalk is configured to couple to at least one neighboring microstructure stalk when said gripping surface is in an engaged state, and wherein said second electrical conductivity is higher than said first electrical conductivity;
    a plurality of sensing electrodes disposed on or adjacent to said backing layer, wherein any two sensing electrodes of said plurality of sensing electrodes are configured to measure voltage; and
    one or more computer processors operatively coupled to said plurality of sensing electrodes, wherein said one or more computer processors are individually or collectively programmed to (i) apply a current to said backing layer, (ii) receive a reading of said voltage, and (iii) based on said reading of said voltage, determine said engaged state of said gripping surface.

2. The system of claim 1, wherein a change in said reading of said voltage is indicative of an engaged state.

3. The system of claim 1, wherein said current is direct current, and said engaged state is determined when each microstructure stalk contacts at least one neighboring microstructure stalk.

4. The system of claim 1, wherein said current is an alternating current, and said engaged state is determined when each microstructure stalk achieves near contact with at least one neighboring microstructure stalk.

5. The system of claim 1, wherein said second electrical conductivity is at least one or more magnitudes higher than said first electrical conductivity.

6. The system of claim 1, wherein said one or more computer processors are individually or collectively programmed to perform a mechanical action on said gripping surface based at least in part on said engaged state.

7. The system of claim 6, wherein said mechanical action is an application or release of shear load.

8. The system of claim 6, wherein said mechanical action is an application or release of pre-load.

9. The system of claim 1, wherein each microstructure stalk of said plurality of microstructure stalks includes a first surface and a second surface, wherein said first surface has a greater surface area than said second surface.

10. The system of claim 1, wherein each microstructure stalk of said plurality of microstructure stalks comprises post-treated tips.

11. A method for sensing engagement of a gripping surface, comprising:
    (a) applying a current to a backing layer of a gripping surface, wherein an end of each microstructure stalk of a plurality of microstructure stalks is attached to said backing layer;
    (b) measuring a voltage or current between a first reference point and a second reference point, wherein said first and second reference points are located on said backing layer;
    (c) opening a conductive pathway between said first and second reference points through said plurality of microstructure stalks, wherein each microstructure stalk is coupled to at least one neighboring microstructure stalk when said gripping surface is in an engaged state and wherein said plurality of microstructure stalks has a higher conductivity than said backing layer; and
    (d) determining, from a change in said voltage or current, said engaged state of said gripping surface.

12. The method of claim 11, wherein a change in a reading of said voltage or current is indicative of an engaged state.

13. The method of claim 11, wherein said plurality of microstructure stalks has an electrical conductivity at least one or more magnitudes higher than an electrical conductivity of said backing layer.

14. The method of claim 11, wherein said current is direct current, and said engaged state is determined when each microstructure stalk contacts at least one neighboring microstructure stalk.

15. The method of claim 11, wherein said current is an alternating current, and said engaged state is determined when each microstructure stalk achieves near contact with at least one neighboring microstructure stalk.

16. The method of claim 11, further comprising performing a mechanical action on said gripping surface based at least in part on said engaged state.

17. The method of claim 16, wherein said mechanical action is an application or release of shear load.

18. The method of claim 16, wherein said mechanical action is an application or release of pre-load.

19. The method of claim 11, wherein each microstructure stalk of said plurality of microstructure stalks includes a first surface and a second surface, wherein said first surface has a greater surface area than said second surface.

20. The method of claim 11, wherein each microstructure stalk of said plurality of microstructure stalks comprises post-treated tips.

* * * * *